United States Patent
Di Ricco Kurzava et al.

(10) Patent No.: US 9,826,655 B1
(45) Date of Patent: Nov. 21, 2017

(54) METHOD AND APPARATUS FOR MOUNTING A CIRCUIT BOARD IN AN ENCLOSURE

(71) Applicant: Oracle International Corporation, Redwood City, CA (US)

(72) Inventors: Rebecca Di Ricco Kurzava, San Diego, CA (US); Eric M. Innes, San Diego, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 15/380,339

(22) Filed: Dec. 15, 2016

(51) Int. Cl.
*H05K 7/14* (2006.01)

(52) U.S. Cl.
CPC ......... *H05K 7/1427* (2013.01); *H05K 7/1402* (2013.01); *H05K 7/1487* (2013.01)

(58) Field of Classification Search
CPC ........................... H05K 2201/044; H05K 1/14
USPC ....................................................... 361/788
See application file for complete search history.

(56) References Cited

U.S. PATENT DOCUMENTS

2010/0254089 A1* 10/2010 Anderl ................ H01L 23/4093
361/702

* cited by examiner

*Primary Examiner* — Hoa C Nguyen
*Assistant Examiner* — Stanley Tso
(74) *Attorney, Agent, or Firm* — Marsh Fischmann & Breyfogle LLP; Kent A. Lembke

(57) ABSTRACT

A mounting assembly for accurately positioning, attaching, and supporting a circuit board such as a midplane board within a chassis. The assembly's design facilitates an improved assembly method that includes fastening the board to the chassis so to provide reliable connector mate and rapid assembly. The mounting assembly includes a clamp member) and a spring assembly that act in combination to secure a circuit board onto datum features provided on a chassis and/or its modified and/or lightweight alignment bulkhead, which is part of the new assembly. The new assembly design enables a tight tolerance loop between mating components while also providing a more consistent connector engagement when compared with many prior device designs. In some embodiments, a single fastener (e.g., a nut) is used to attach the clamped and captured circuit board to the chassis. The board is "captured" as it is sandwiched between the modified bulkhead and the clamp.

11 Claims, 23 Drawing Sheets

METHOD AND APPARATUS FOR MOUNTING A CIRCUIT BOARD IN AN ENCLOSURE

BACKGROUND

1. Field of the Invention

The present invention generally relates to mounting of assembly of servers and other computer equipment, telecommunications equipment, and electronics in a standard enclosure or box (simply called "chassis" herein) that will then, often but not always, be mounted in a rack with other enclosures/boxes (i.e., each being a rack-mountable chassis), and, more particularly, to an mounting or fastening assembly adapted for positioning, attaching, and supporting a printed circuit board (PCB) or PCB with other electronic components in the form of a printed circuit assembly (PCA) (herein, both are referred to more simply as "boards"), with a typical arrangement being to mount the board vertically within a chassis between two vertical chassis sidewalls such as to provide a midplane board (or midplane PCA).

2. Relevant Background

There are numerous settings or environments where electronic equipment, computers and computer equipment (e.g., servers, routers, and so on), and telecommunications equipment are provided in a centralized location in standard or conventional racks. Often, this equipment is provided within a box or chassis that is then mounted within the rack. Such use of racks with configurable electronic or computer devices each in a chassis can be found in data centers, computer rooms, network rooms, control rooms, telecommunication centers, and so on.

As a specific example, servers and other computing devices are often each provided in such a chassis. During assembly of each of these devices, it is common for a PCB or PCA (or "board") to be mounted vertically in each with its ends extending between the vertical side walls of the chassis. Such a board is mounted between the rear and front ends of the chassis, and this PCA or simply "board" or "circuit board" may be a midplane board (or midplane PCA). Assembly of a server or other device in a chassis can be time consuming and tool-intensive work, and this is due, in part, to the need for very accurate alignment of the midplane board within the chassis to allow later installed components to mate with the midplane boarder.

More specifically, the midplane board has to be provided in a specific location (as measured with X, Y, and Z coordinates) so that its connectors can be effectively mated with connectors on the later installed components (such as a fan module, a data storage module, a power module, and so on). In most designs, a bulkhead that was fabricated to be rigid and relatively heavy duty was provided in the chassis, with the bulkhead including a plurality of guide pins for receiving the midplane board. Assembly required attachment of the midplane board to this bulkhead with a plurality of fasteners to achieve desired alignment and support of the midplane board. This design required a larger number of parts and tools such that it was relatively costly with regard to parts and/or materials and with regard to assembly time (i.e., some assembly times are in the range of 25 to 35 minutes for midplane board installation in a chassis).

In designing chassis-based computer and other devices, mechanical tolerance stacks can make it difficult to achieve full connector mate, and achieving proper midplane board-to-inserted module/component connection can be especially problematic on blind-mate assemblies and even more so when sequencing of connections exist in the device's design. For example, on an edge card connector, there may be three or more sequential mates, which requires that the pads on the midplane board be increasingly shorter lengths and, yet, all must be fully engaged electrically with the mating connector when the assemblies are fully seated. Consequently, the tolerance margin for full mate becomes increasingly small, and this leads to issues including over-mate (i.e., parts crashing together during assembly or assemblies not being able to properly install and/or latch) or under-mate (i.e., one or more electrical connections with insufficient contact leading to improper operations of the assembled device).

One way that industry designers have addressed these assembly challenges is to have mechanical compliance designed into one or more assemblies. For example, a design may include floating connectors and floating boards, which are designed with a spring force and a nominal over-mate. In other designs, there are ejector arms, which use cam action to seat the connector and allow some over-mate while allowing the overall system compliance (e.g., chassis parts, midplane board bending, and the like) to act as the "spring." In many existing designs, the midplane board must be seated accurately to reduce the tolerances between the mating connectors. To this end, a large, expensive machined bulkhead is employed in the design, and the midplane board is fastened to this bulkhead with screws. However, accessing these screws with a screw driver is often difficult because the midplane board is buried in the middle of the chassis, which can cause assembly issues or, at the very least, undesirably increase the assembly time required for such designs.

SUMMARY

Briefly, a fastening or mounting assembly is provided for accurately positioning, attaching, and supporting a circuit board (e.g., a PCA), such as a midplane board, within a chassis. The assembly's design facilitates an improved assembly method that includes fastening the circuit board to the chassis so to provide reliable connector mate and rapid assembly (and disassembly). Briefly, the fastening (or mounting) assembly includes a clamp (or clamping member) and a spring assembly (e.g., a compression spring assembly with flexible components such as bumpers or pads formed of an elastomer such as a rubber) that act in combination to secure a circuit board (e.g., a PCA providing a midplane board) onto datum features provided on a chassis (and/or its modified and/or lightweight alignment bulkhead, which is part of the new assembly).

The new assembly design enables a tight tolerance loop between mating components while also providing a more consistent connector engagement when compared with many prior device designs. In some embodiments, a single fastener (e.g., a nut) is used to attach the clamp and captured board to the chassis (e.g., the board is "captured" in the design as it is sandwiched between the modified bulkhead and the clamp), and the use of one fastener simplifies assembly with accurate alignment of connectors, which also significantly reduces the assembly time (e.g., from 30 minutes down to about 1 minute) of the board within the chassis.

More particularly, a computer apparatus adapted for efficient installation of a circuit board (e.g., a midplane or other board that may take the form of a PCA). The apparatus includes a chassis (such as an enclosure designed to be rack mountable) with a first sidewall and a second sidewall opposite the first sidewall. The apparatus also includes a vertically oriented bulkhead extending orthogonally between the first and second sidewalls of the chassis. Further, the apparatus includes a clamp member with a planar body pivotally coupled at a first end to the first sidewall and coupled at a second end opposite the first end to the bulkhead. A circuit board is sandwiched between the bulkhead and the body of the clamp member with a first side facing the bulkhead and a second side facing the body of the clamp member. Additionally, the apparatus includes a compression spring assembly on a surface of the planar body of the clamp member that faces the second side of the circuit board, and, upon full assembly of the apparatus, the compression spring assembly applies at least one preload force to the second side of the circuit board urging the board toward the bulkhead.

In some embodiments, the compression spring assembly includes a plurality of spaced-apart bumper elements mounted on the planar body of the clamp member each having a pad formed of an elastomeric and/or non-conductive material on the surface of the planar body of the clamp member. For example, the elastomeric material or elastomer may be rubber, and the bumper element may be designed for tool-less mounting onto the body of the clamp member (e.g., compression as it is pulled by hand through a hole and expansion to retain it in place on the clamp body).

In the same or other embodiments, the planar body is pivotally coupled to the first sidewall via at least one hook on the first end of the body of the clamp member and at least one hook receptacle on an inward facing surface of the first sidewall of the chassis, whereby coupling is achieved in a tool-less manner. The second end of the planar body of the clamp member is coupled to the bulkhead via a threaded member extending from and affixed to the bulkhead and a fastener threaded onto the threaded member and abutting the planar body of the clamp member. Then, the fastener is torqued to a predefined torque and/or until a lip on the second end of the planar body contacts a stop provided on the second sidewall of the chassis.

In some implementations of the apparatus, the planar body has a length as measured between the first and second ends that is equal to or greater than a length of the circuit board, and the clamp member includes a least one stiffening element extending orthogonally outward from an edge of the planar body between the first and second ends of the planar body. In the same or other implementations, the bulkhead includes a set of locating tabs extending outward from a side of the bulkhead that faces the circuit board, and the circuit board is positioned relative to the bulkhead with one or more tab receiving surfaces abutting or proximate to each of the locating tabs, whereby the circuit board is accurately positioned relative to the bulkhead. In such implementations, the set of locating tabs may include at least two vertical locating tabs limiting vertical travel (Y-axis positioning/alignment) of the circuit board and at least one horizontal locating tabs limiting horizontal travel (X-axis positioning/alignment) of the circuit board.

DETAILED DESCRIPTION

Figure 1:
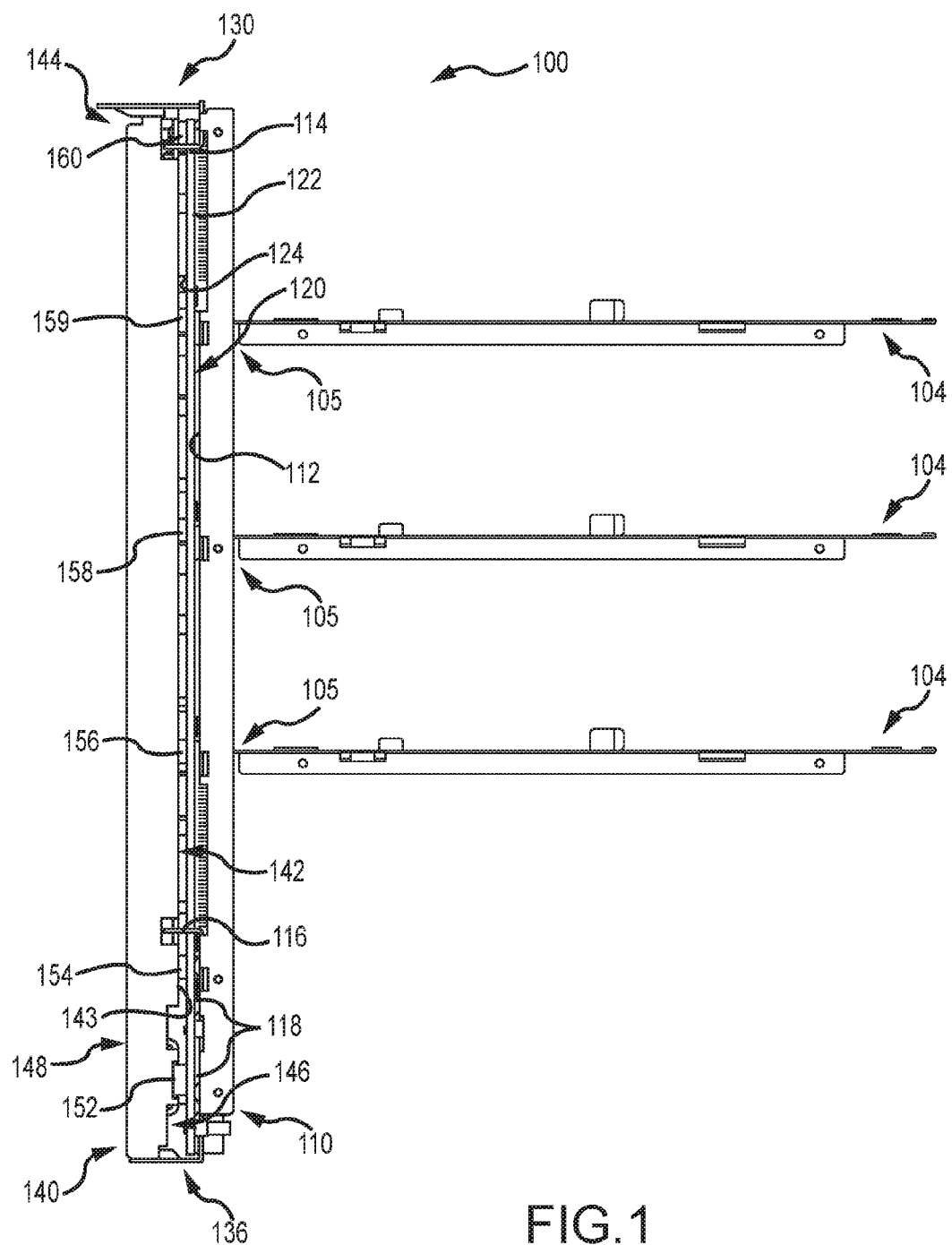
FIG. 1 illustrates a top view of a mounting assembly of the present description with a circuit board (e.g., a PCA or the like that may provide a midplane board) sandwiched between a bulkhead and a clamp member of the mounting assembly (with the chassis not shown to simplify initial descriptions of the mounting assembly)

The present description is directed toward an assembly for mounting (or fastening) circuit boards (such as a printed circuit assembly (PCA) providing a midplane board or the like) within a chassis and, also, toward chassis-based devices that include a chassis with a circuit board mounted within it using the presently described mounting assembly. Briefly, the mounting assembly includes a specially-designed, lightweight bulkhead that is attached to the sidewalls of the chassis in combination with a clamp (or clamp member) and a compression spring assembly. A circuit board, upon assembly, is sandwiched between the bulkhead and the clamp, with the compression spring assembly provided on the board-facing side of the clamp applying constant preload forces along the length of the circuit board.

With the new mounting assembly design, instead of using numerous fasteners (e.g., screws) to attach the board directly to a stiff machined bulkhead, the assembly's clamp member clamps the board against a sheet metal (or lightweight) bulkhead that is abutting ends of the divider walls in the chassis. The lightweight (or modified) bulkhead (with the divider walls) locate the Z-axis (or connector wipe axis) position of the board and also the latching location of a blind-mate tray/sled/module assembly. Because both of these features (e.g., midplane or board datum and latch catch) are on the same sheet metal part, the tolerance is punch-to-punch, which can be held relatively low (e.g., 0.13 millimeters for standard manufacturing processes).

Instead of a stiff machined bulkhead as in prior designs, the clamp member is designed to provide a desired stiffness for the circuit board. The clamp member can be made of sheet metal with a high bending moment provided by folds perpendicular to the connector insertion force direction (e.g., to a "beam" extending outward, along a portion of or the entire length of the beam member's body, from one or both the upper and lower edges of the body of the clamp member away from the circuit board and the bulkhead).

In some embodiments, the compression spring assembly is provided via a plurality (e.g., two to eight or more) of elastomeric compression springs (or pads/bumpers) mounted to the board facing and/or contacting side of the clamp member (e.g., between the clamp and the circuit board), and these elastomeric compression springs set the clamping force and provide margin so that the clamp member's body does not have to be perfectly flat or planar (or the side facing the board does not have to be perfectly flat). This provides a flexible and versatile design for the mounting assembly as the properties (e.g., size, shape, durometer, and so on) of the rubber (or other elastomeric material) pads/bumpers/springs can be chosen to achieve a desired clamping force. Similarly, the spacing between the clamp member and the board can be adjusted. The entire clamp can be made somewhat flexible such that it becomes the spring element. This would have the benefit of eliminating the elastomeric bumper and/or individual springs (e.g., provide further part count reduction) while retaining the functionality of the design.

The elastomeric pads/bumpers/springs can be placed in a variety of locations on the clamp member's body to act to clamp the circuit board to the bulkhead and chassis' sidewalls and/or to provide opposing forces for connector insertion into connectors on the circuit board during later device assembly steps. In one particular implementation (i.e., the M8 IOEU design), there are individual small bumpers (e.g., formed of an elastomer) installed on the clamp member's body, and each of these bumpers are applied to the clamp member in a tool-less manner via snapping into holes in the clamp member's body (with the holes setting locations for the bumpers/springs on the body's surface). A variety of other designs for the compression spring assembly may also be utilized when implementing the mounting assembly. For example, a molded elastomer sheet(s) with one-to-multiple thicknesses may be used to provide a variable pressure profiled on the circuit board (rather than a single preload forces provided with bumpers of the same material, shape, and size as used in some embodiments). In other words, the mounting assembly design can be customized for higher or lower force requirements within a single part.

As will be appreciated from a review of this description, the mounting assembly enables fast and easy installation of a circuit board (e.g., a midplane board). The board slides onto some simple sheet metal folds (or, as labeled herein, vertical and horizontal locating tabs to refer to X-axis and Y-axis locating with the understanding that the orientation may not be strictly "horizontal" or "vertical" as the mounting assembly is not orientation-specific), via holes/openings in the circuit board, that provide X and Y positioning of the circuit board within the interior space of the chassis. Then, the clamp member is pivotally coupled to one of the chassis sidewalls via a hook extending through an opening/hole in the chassis sidewall. The clamp member is then rotated (or pivoted) about this pivotal coupling location (e.g., contact between the hook on one end of the clamp member body and the chassis sidewall) so as to be on or in abutting contact with the circuit board (or, more accurately, with the set of compression springs/bumpers/pads in contact with the outward facing side/surface of the circuit board). A threaded member or bolt extends outward from the bulkhead and through receiving holes in the board and body of the clamp member, and, with the clamp member rotated/pivoted into position against the board, a single fastener (i.e., a nut) is used to complete assembly when it is placed upon the threaded member and tightened. In some embodiments, the threaded screw and nut combination is replaced with a snap-fit retention feature so as to achieve tool-less assembly. The tightening of the nut also applies the mechanical advantage to compress the rubber (or other elastomeric material) of the compression spring assembly. A hard stop may be included in the mounting assembly, such as built into the chassis (e.g., on or extending from a sidewall of the chassis), to set the final location of the clamp (e.g., by limiting the travel of the clamp body during tightening of the nut) and, therefore, the board-to-clamp member's body spacing for the desired (and, typically, predefined) clamping force (or preload force).

FIG. 1 illustrates a top view of a mounting assembly 100 of the present description, and this mounting assembly 100 typically would be provided within a chassis that is not shown in this figure for ease of initial description. As shown, three dividing walls 104 are provided that would be mounted in a chassis to be vertical to the base plate of the chassis and extend from an end of the chassis. The inner ends 105 of these three dividing walls 104 are used to define the Z-position of the mounting assembly 100 or, more specifically, of a circuit board (e.g., a PCA used as a midplane board) 120 within a chassis. With this in mind, the mounting assembly 100 includes a bulkhead 110 and a clamp member 140, and the board (e.g., a PCA or the like) 120 is sandwiched between the bulkhead 110 and the clamp member 140 upon completion of the assembling of the mounting assembly 100 as shown. The bulkhead 110 is affixed to the ends 105 of the dividing walls 104 so as to be accurately located (e.g., within a chassis) and to be vertical and to be orthogonal to these dividing walls 104 (or planes extending through these walls 104). Typically, when the mounting assembly 100 is provided in a chassis, the bulkhead 110 may also be affixed to the chassis (such as to its base plate and/or its sidewalls), and the bulkhead 110 may have a length such that it extends between chassis sidewalls (or a length that matches that of the received circuit board 120).

The bulkhead 110 includes a board-mating surface 112 that faces the board 120 and clamp member 140. Upon assembly, a first surface or side 122 of the board 120 may positioned against or so as to abut portions of the board-mating surface 112 such as to contact raised pads or posts 118. Also, as explained in more detail below, the bulkhead 110 is adapted with a number tabs or guides extending outward from the board-mating surface 112 that are used to provide positioning and/or alignment (e.g., vertical and horizontal positioning) of the board 120 within a chassis (or, at least, relative to the bulkhead 110). The board 120 includes a number of holes or gaps for receiving these locating/alignment tabs and allowing the tabs of the bulkhead to pass through the board 120. In FIG. 1, a pair of vertical position-locating tabs 114, 116 are shown to extend outward from the board-mating surface 112 through the board 120, and these provide vertical (or Y-axis) positioning by limiting travel of the board in the vertical direction (or away from a chassis base plate) upon assembly of the mounting assembly 100.

Further, as shown, the mounting assembly 100 includes the clamp member 140 that acts to restrain the board 120 in the desired location relative to the bulkhead 110 (e.g., the board 120 is sandwiched between the bulkhead 110 and the claim member 140 such that it cannot move or only move a relative small amount to ensure later connection with connectors on the board 120 with later installed components in a chassis). As shown, the mounting assembly 100 includes a pair of chassis wall mounting elements 130, 136 that in use would be provided on opposite sidewalls of a chassis, and the chassis wall mounting elements 130, 136 act to assist in positioning and retaining the clamp member 140 in a particular position in the chassis relative to the board 120 and bulkhead 110.

Particularly, the clamp member 140 includes an elongated (and typically planar) body 142 that extends from a first end 144 to a second end 146. A mating hook or pivotal connection element on the first end 144 that is inserted into and pivotally mates with a receptacle or receiving hole on the first chassis wall mounting element 130. A lip or recessed stop-receiving surface is provided on the second end of the clamp member 140 to mate with a stop extending outward from the second chassis wall mounting element 136 to prevent further rotation of the clamp member 140 about the pivotal connection between the hook and the receptacle/receiving hole of the first chassis wall mounting element 130. These components act in combination to provide accurate positioning of the clamp member 140 relative to the board 120 and bulkhead 110 during assembling operations for the mounting assembly 100.

To provide rigidity and/or physical strength to the clamp member 140, a stiffening element or rib 148 (or ribs such as an upper and lower rib) is provided that extends between the ends 144, 146, and this allows the body 142 to be formed of a relatively thin sheet metal (or plastic or other material) as the body 142 has its rigidity enhanced or retained by the stiffening element or rib(s) 148. The length of the clamping member 140 (and the body 142 and stiffening element 148) typically is chosen to extend at least the length of the board 120, which often results in its length matching or being some small amount less than a width of the interior space of a chassis receiving the mounting assembly 100. The width (as measured from the body 142 and shown as $W_1$ in FIG. 2) of the stiffening element 148 may be varied to practice the mounting assembly 100 with some useful embodiments using a width of 0.125 to 0.5 inches with the body 142 and stiffening element 148 formed of sheet metal (e.g., by bending the edges of the sheet metal to define or provide the stiffening elements 148).

One unique aspect of the mounting assembly 100 is the inclusion of a compression spring assembly to apply constant preload forces along the length of the board 120 (e.g., on clamp-facing surface 124). Such spring-based loading may be provided in a variety of ways such as through the use of metal springs provided on the clamp member 140, through the use of a single pad of elastic material on the board-facing surface 143 of the body 142 of the clamp member 140, and the like. As shown, though, the mounting assembly 100 provides the compression spring assembly by including a plurality of bumper elements affixed to the body 142 to provide pads 152, 154, 156, 158, 159, 160 on the board-facing surface 143 of the body 142. The shape, size, thickness, and location of these pads 152, 154, 156, 158, 159, 160 may be varied to achieve desired spring forces on the board 120. The bumper elements are typically formed of a material that is not conductive of electricity so as to also act as an electric insulator between the board 120 and the clamp member 140. In some cases, the bumper elements are formed of a relatively soft elastomer (which also facilitates tool-less assembly of the bumper elements on the clamp member body 142 as discussed below).

Figure 2:
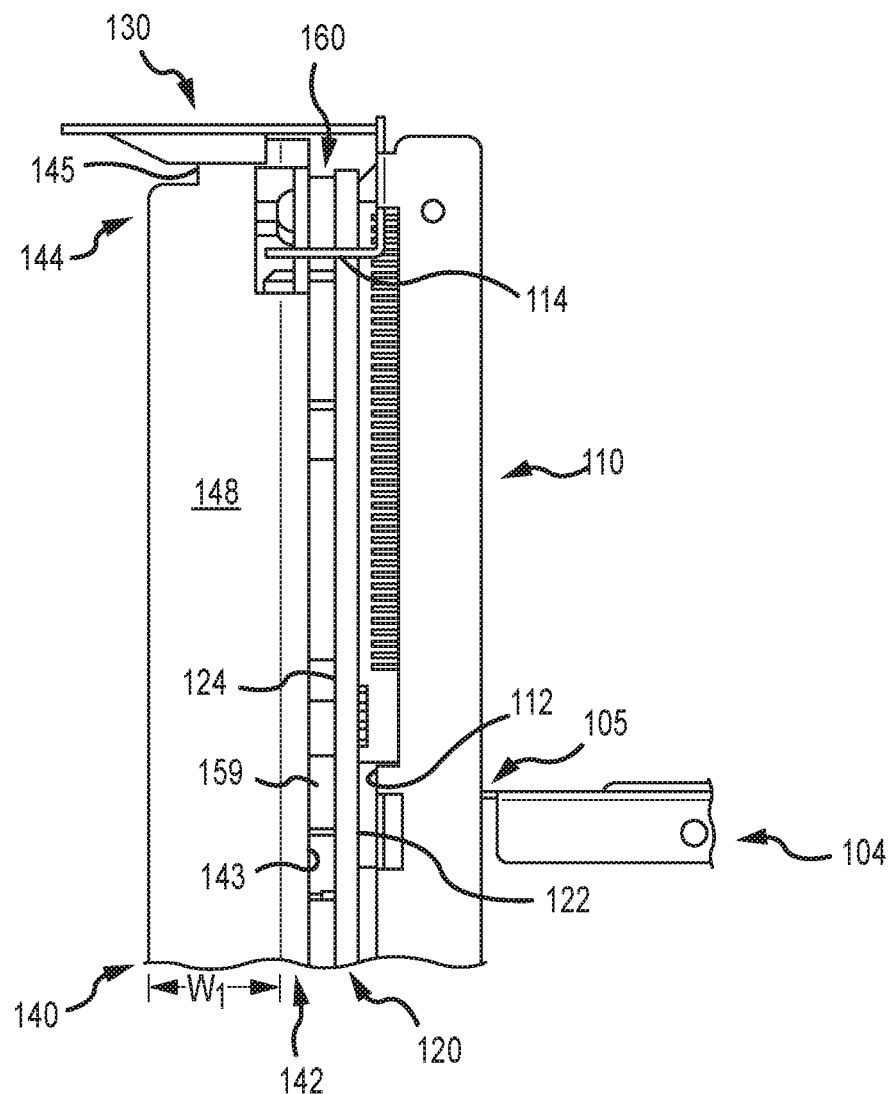
FIG. 2 illustrates a detailed or enlarged view of the left end (or hook end) of the mounting assembly of FIG. 1.

FIG. 2 illustrates a detailed or enlarged view of the left end (or hook end) 144 of the mounting assembly 100. As shown, the first chassis wall mounting element 130 receives and provides a pivotal contact point for a hook 145 on the left end 144 of the body 142 of the clamp member 140. When the clamp member 140 is rotated about this pivot point to abut the board 120 as shown, the pads 159, 160 contact or abut the clamp-facing surface 124 of the board 120 (rather than having a direct body-to-board contact). As a tightening force or mating torque is applied to the assembly 100 (as explained below with a single fastener or nut in some embodiments), the rubber or other elastomeric (non-conductive) material of the pads 159, 160 is compressed and a force is applied to the board 120 that retains it in its desired location including maintaining the contact between the board 120 and the bulkhead 110 (or between surface 122 of the board 120 and surface 112 of the bulkhead 110).

Figure 3:
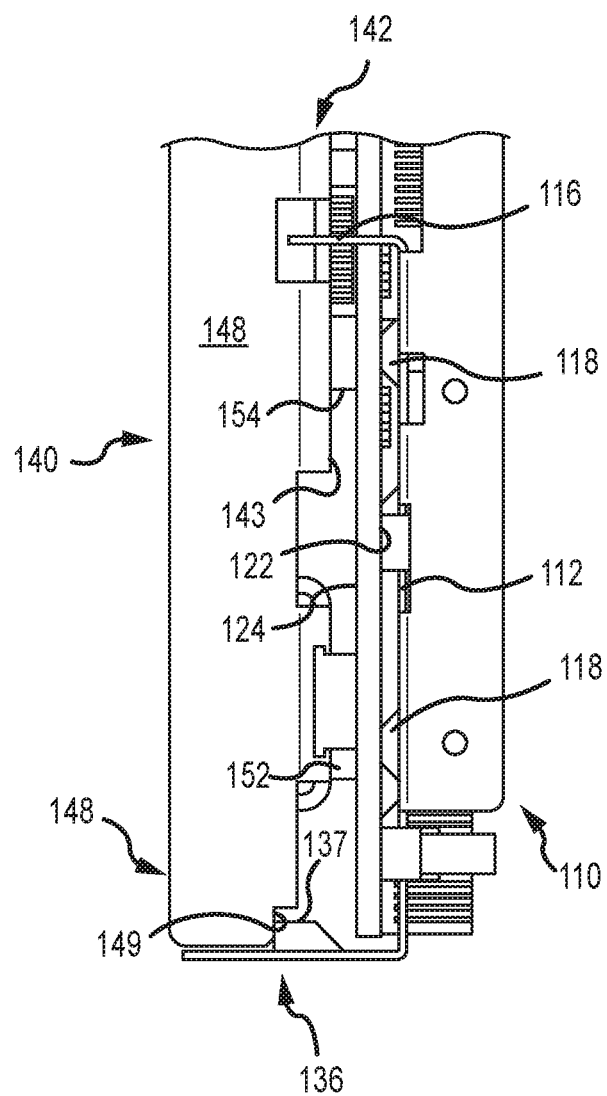
FIG. 3 illustrates a detailed or enlarged view of the right end (or stop-mating end) of the mounting assembly of FIG. 1.

FIG. 3 illustrates a detailed or enlarged view of the right end (or stop-mating end) 148 of the mounting assembly 100, with the clamping member 140 rotated about the hook end 144 to sandwich the board 120 against the bulkhead 110. In this position, the pads 152, 154 are compressed (at least some amount). This causes them to apply preload forces against the board surface 124, which causes the board's surface 122 to be retained in contact with the raised pads/posts 118 (and X and/or Y locating tabs as shown with vertical position-locating tab 116). The amount of rotation or pivoting of the clamp member 140 is limited or defined by the contact between the stop 137 on the second chassis wall mounting element 136 and the lip/shelf 149 on the end 148 of the body 142 of the clamp member 140 (or provided by an extension of the stiffening element 148 a distance beyond the body 142). Hence, during assembly, a technician is able to assembly the mounting assembly 100 by rotating the clamp member 140 into a position where the body 142 passes over a threaded member (e.g., a bolt or threaded rod) extending out from the bulkhead 110 and a fastener (such as a nut) can be coupled with this threaded member. Then, the fastener can be tightened to a desired torque and/or until the contact between the stop 137 and lip 149 is achieved, which ensures accurate application of a uniform (or relatively uniform) force with the pads of the bumper elements and accurate positioning and alignment of the circuit board 120 and its connectors relative to the bulkhead 110 (and a chassis in which the bulkhead is positioned/installed).

Figure 4:
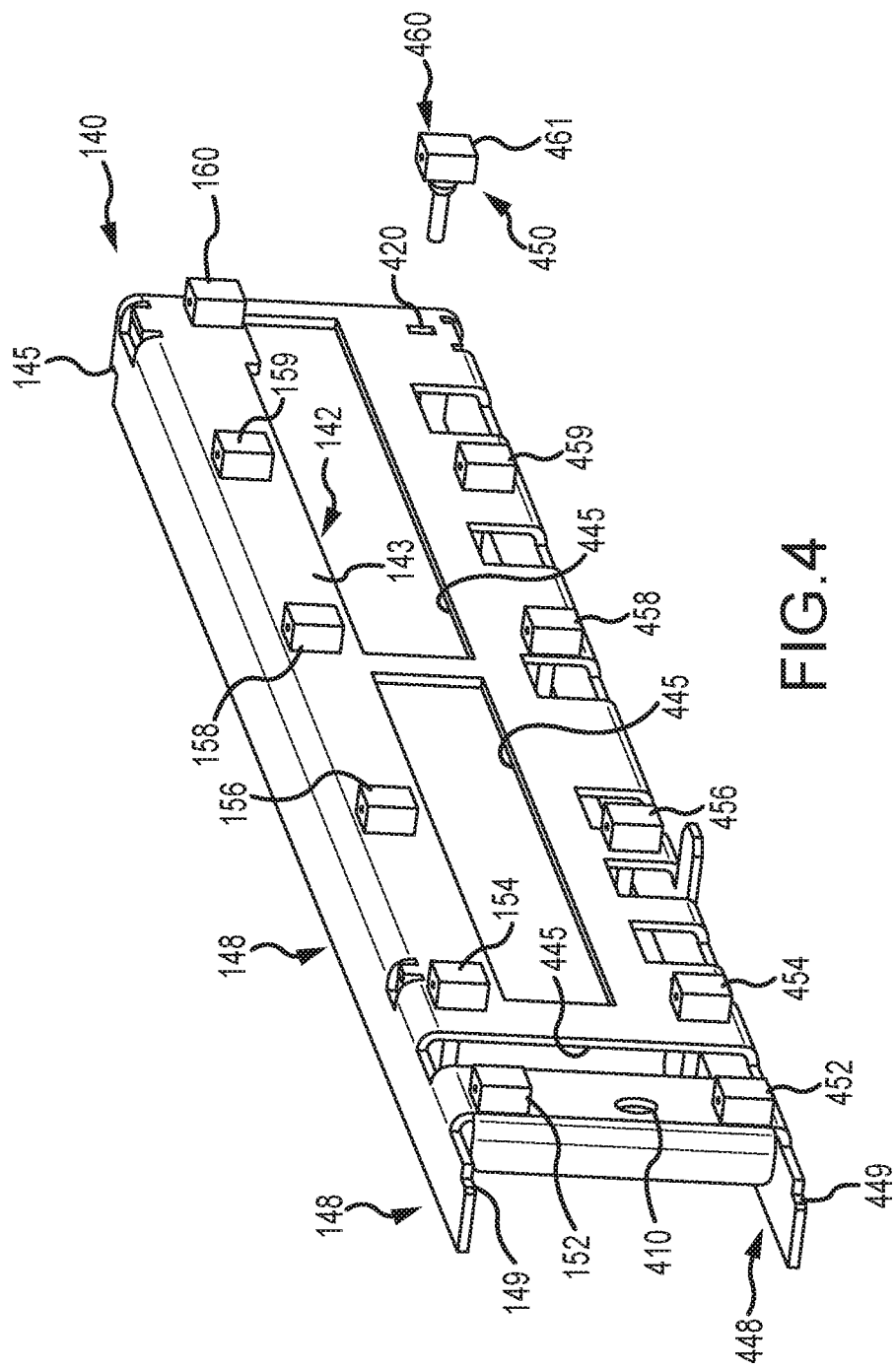
FIG. 4 is a perspective view of the clamp member of FIGS. 1-3 from the board-mating side/surface showing the pads provided by the compression spring assembly, with one bumper element shown prior to its insertion into a hole/receptacle in the body of the clamp member.

FIG. 4 is a perspective view of the clamp member 140 of FIGS. 1-3 from the board-mating side/surface 143 showing the pads 152, 154, 156, 158, 159, and 160 provided by the compression spring assembly. The spring assembly is shown in more detail to also include the pads 452, 454, 456, 458, 459, and 460 (or lower row of bumper or spring elements in addition to the upper row, and FIG. 4 also shows that the clamp member 140 includes a second or lower stiffening element 448 extending outward from the lower edge of the body 142 (and a second lip/shelf 449 to mate with a second stop on the second chassis wall mounting element 136). Further, the body 142 is shown to include one or more holes or gaps 445 to provide access paths to connectors on the circuit board. In FIG. 4, the compression spring assembly is shown to be partially assembled with one bumper element 450 shown prior to its insertion into a hole/receptacle 420 in the body 142 of the clamp member 140. As shown, in FIG. 4 the pads of the compression spring assembly are arranged in two rows and relatively equidistally spaced apart to apply the preload forces in a relatively uniform manner across the surface of the circuit board at the locations of each of these pads. Again, the number, thickness, size, shape, and location of these pads may be varied to practice the mounting assembly 100 of the present description.

Figure 5:
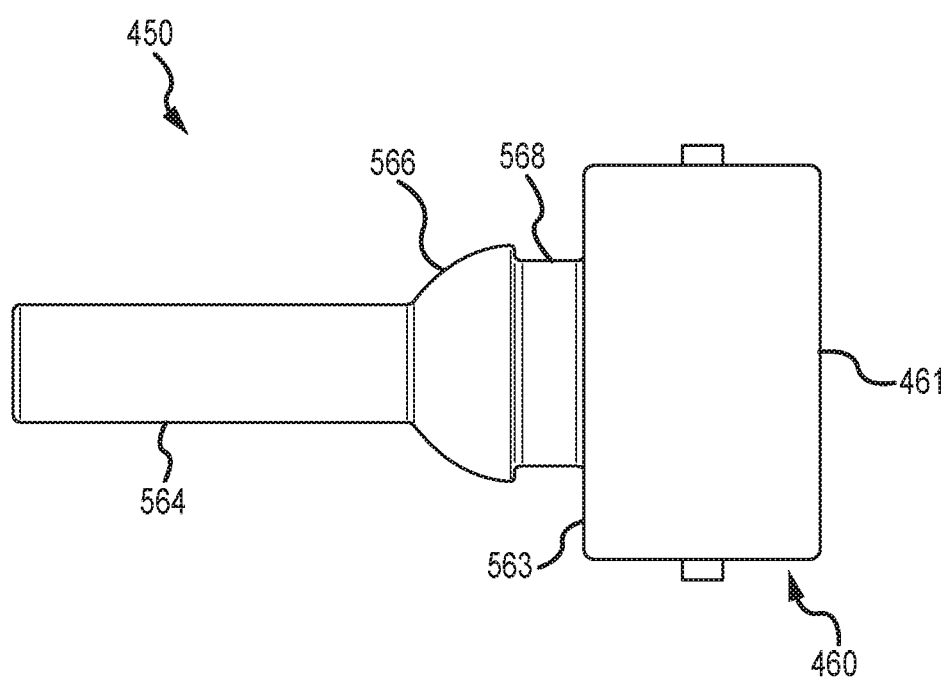
FIG. 5 is a side view of one embodiment of a bumper element for use in a compression spring assembly of the present description such as in mounting assembly of FIGS. 1-4.

The bumper element 450 is adapted for tool-less mounting onto the clamping member 140. FIG. 5 is a side view of one embodiment of a bumper element 450 for use in a compression spring assembly of the present description such as in mounting assembly 100. As shown, the bumper element 450 includes a post or pin 564 for insertion into the hole/receptacle 420 in the body 142 of the clamp member 140 and for a technician to apply a pulling force on the bumper element 450 during assembly. Particular, the bumper element 450 also includes a bulbous head 566 adjacent the post/pin 564 that is a hemisphere with a diameter that is larger than the dimensions of the hole/receptacle 420 and recessed surface or smaller diameter clamp-mating post 568 with a diameter matching or slightly greater than the dimensions of the hole/receptacle 420. The pad 460 is then affixed to the opposite side of this clamp-mating post 568, and the pad 460 is rectangular in shape with dimensions that are significantly larger than the hole/receptacle 420 to provide a clamp-mating surface 563 and an opposite board-mating surface 461.

Figure 6:
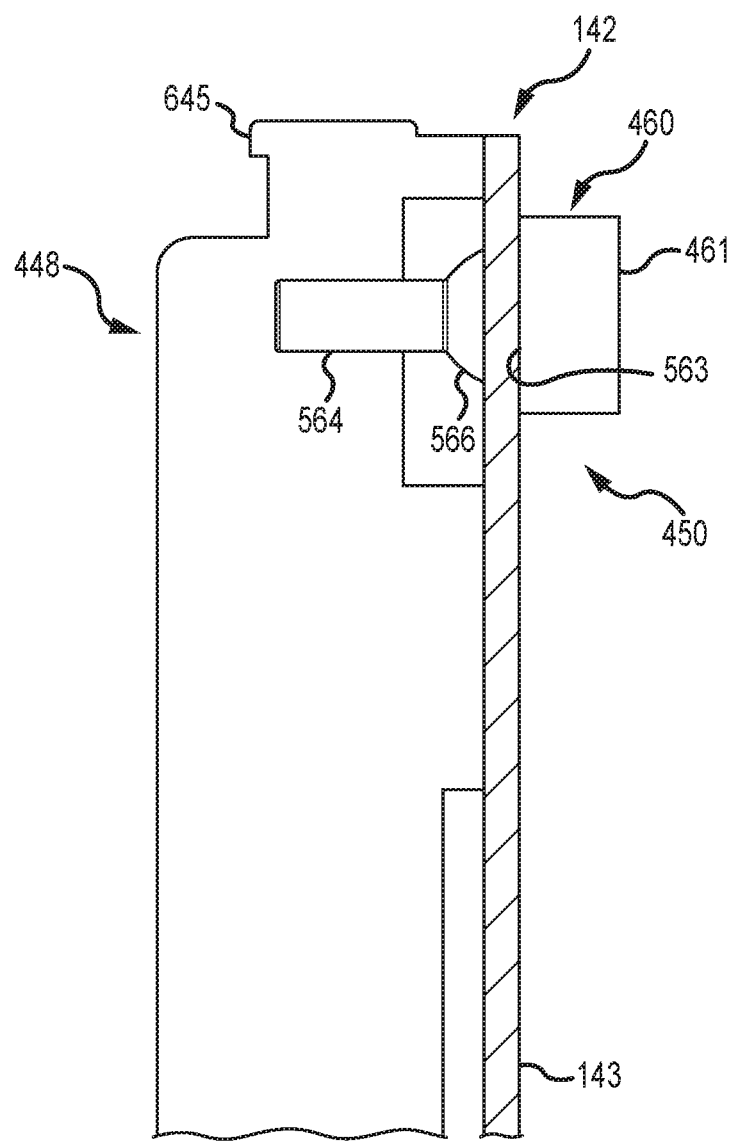
FIG. 6 is a detailed sectional view of the clamp member of FIG. 4 after insertion of the bumper element of FIG. 5 into the clamp member body (in a tool-less manner)

FIG. 6 is a detailed sectional view of the clamp member 140 of FIG. 4 after insertion of the bumper element 450 of FIG. 5 into the clamp member body 142 in a tool-less manner. During assembly, the post/pin 564 is inserted into the hole/receptacle 420 in the body 142 of the clamp member 140. The worker or technician then uses their finger to pull on the post/pin 564 to cause the head 566 to be deformed to match the shape and size of the hole/receptacle 420 to allow it to be pulled through the body 142, and, once through the body 142, the head 566 elastically springs back to its original shape to retain the bumper element 450 on the clamp member 140. The clamp-mating post 568 may also apply an outward force on the inner walls of the hole/receptacle 420 (when it is sized/shaped slightly larger than the inner dimensions of the hole/receptacle 420). The clamp-mating surface 563 of the pad 460 abuts the board-facing surface 143 of the clamp member body 142 while the board-contacting or outer surface 461 is exposed and spaced apart from the body's surface 143 (e.g., to allow it to contact the board and allow some amount of compression of the pad 460 upon full assembly of the mounting assembly 100).

Figure 7:
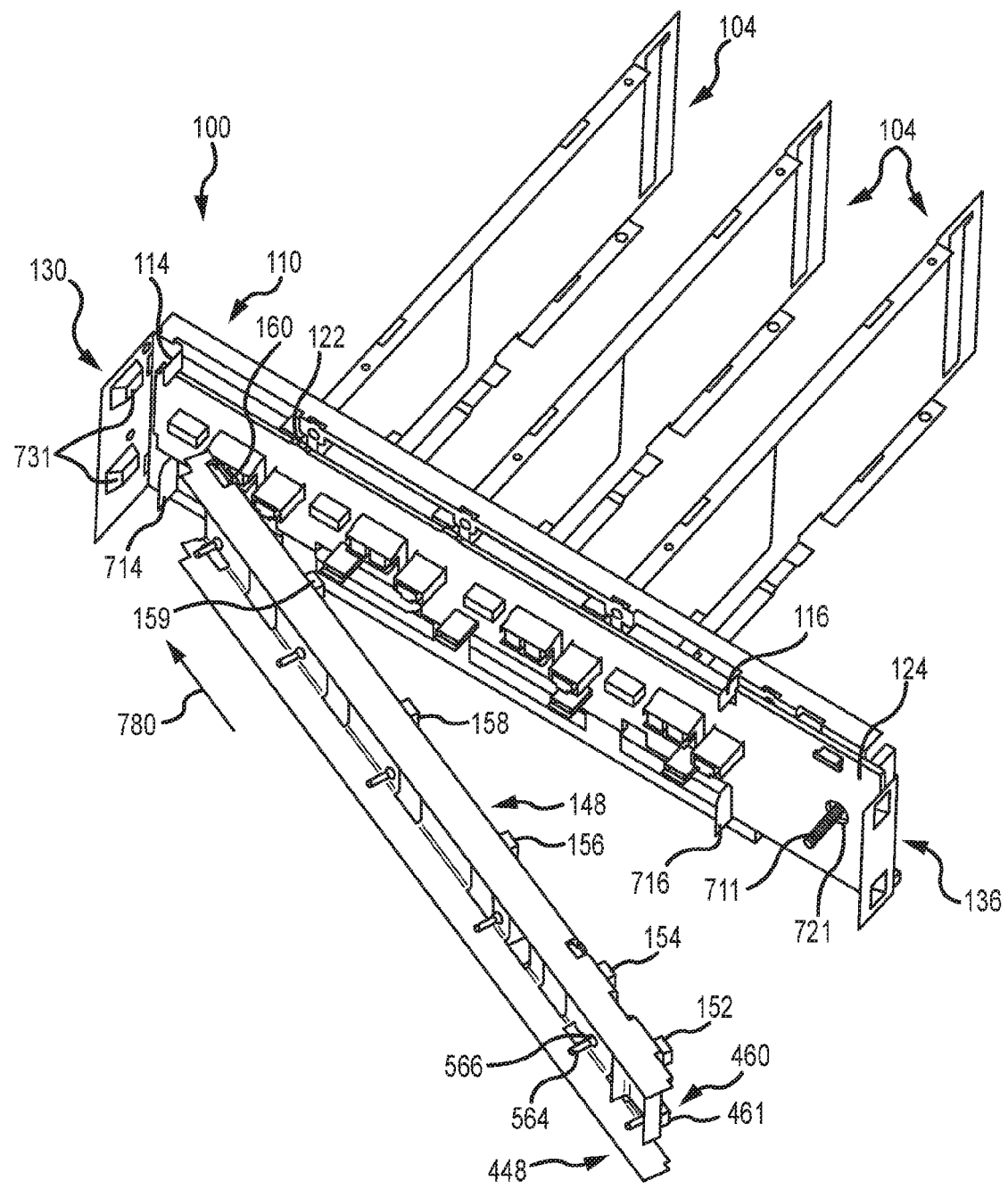
FIGS. 7-13 illustrate the mounting assembly of FIGS. 1-6 during assembly steps used to attach the clamp member within the mounting assembly.
Figure 8:
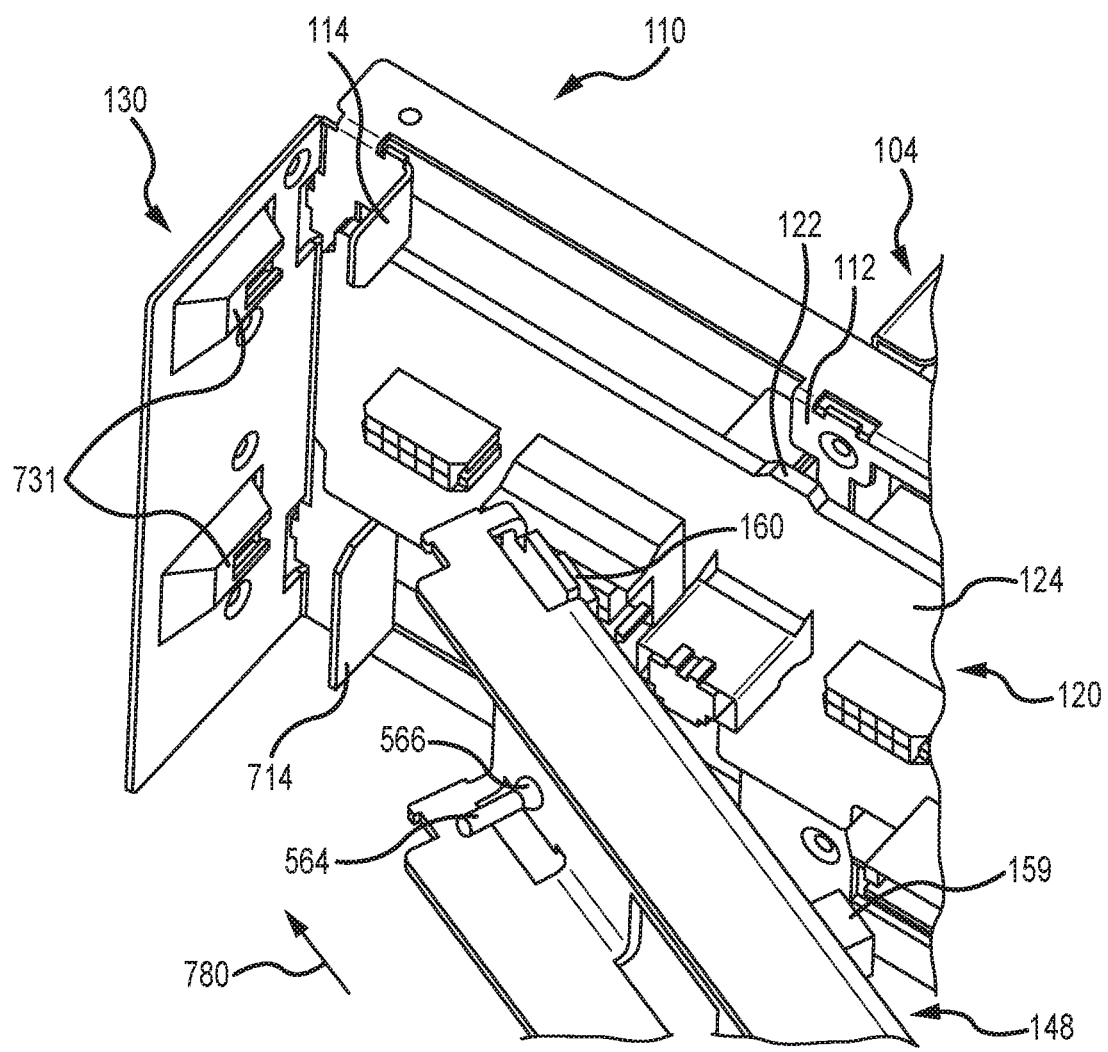

FIGS. 7-13 illustrate the mounting assembly of FIGS. 1-6 during assembly steps used to attach the clamp member 140 within the mounting assembly 100. In FIG. 7, the board 120 has been positioned with its surface 122 against the bulkhead surface 112 and with the locating tabs 114, 714, 116, and 716 extending out from the bulkhead 110 extending through openings in the board 120 and abutting vertical stops and horizontal surfaces/stops/edges of the board 120 to limit its vertical and horizontal travel relative to the bulkhead 110 (e.g., to provide X-Y positioning). Also, the board 120 is shown to include a hole/passageway 721 at one end through which a threaded member/rod 711 extends from the bulkhead 110 (or its surface 112). With the member/rod 711 extending through the hole/passageway 721, the board 710 is further limit in its vertical and horizontal travel. The combination of the locating tabs 114, 116, 714, 716 and fastener 711 and mating surfaces on the board 720 act to accurately position and/or align the board 120 within the mounting assembly 100 relative to the bulkhead 110 (and, therefore, within a chassis based on the ends 105 of the dividing walls 104 setting the location of the bulkhead 110).

Figure 9:
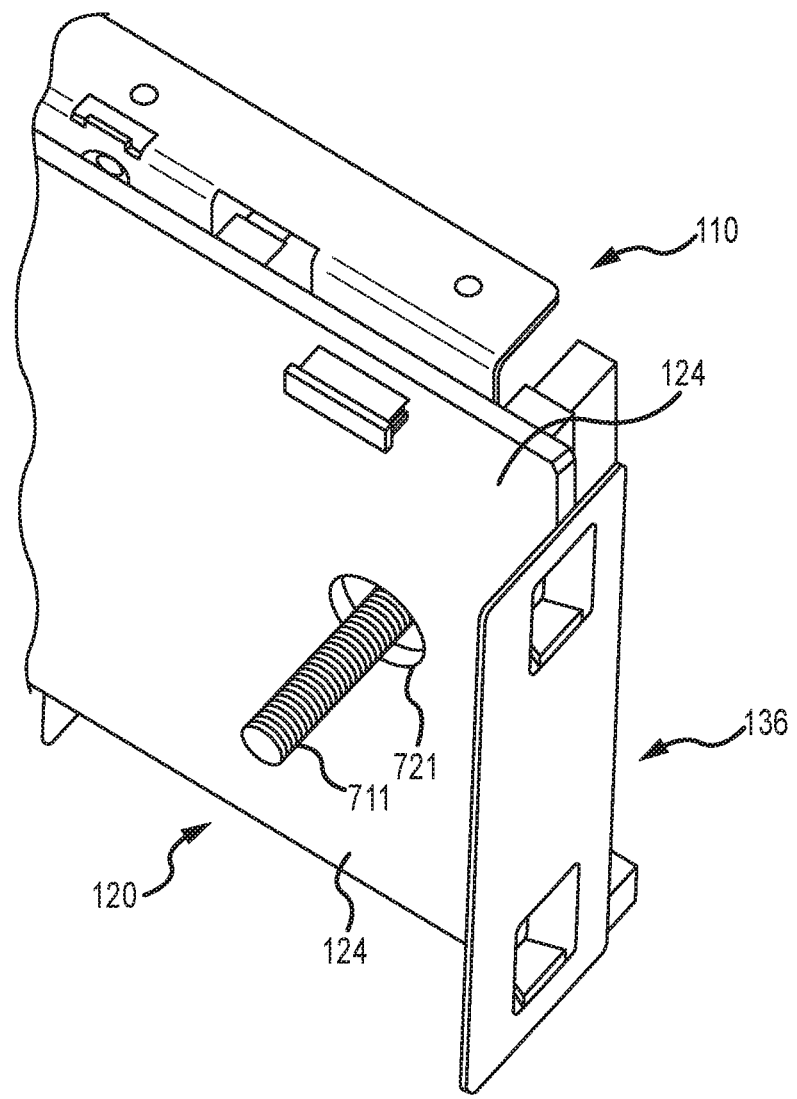

FIG. 7 shows the clamp member 140 prior to engaging with components of the mounting assembly 100 and, particularly, the clamp member 140 is shown as it is being moved 780 toward the left or first chassis wall mounting element 130 and its hook receptacles or pivotal mounts 731. As shown with arrow 780, the clamp member 140 is moved (by a technician assembling the mounting assembly 100) with its board-facing surface 143 (upon which the pads of bumper elements are provided) facing the board 110 and with the left end 144 leading. This can be seen more clearly in FIG. 8 in which the hook 145 is moved toward the upper hook receptacle or pivotal mount 731. FIG. 9 provides a detailed view of the board 120 after it is seated against the bulkhead 110, with the threaded rod/member 711 extending through the hole/passageway 721 in the board 120 (such that the threaded rod/member 711 extends out a distance from the surface/side 124 of the board 120).

Figure 10:
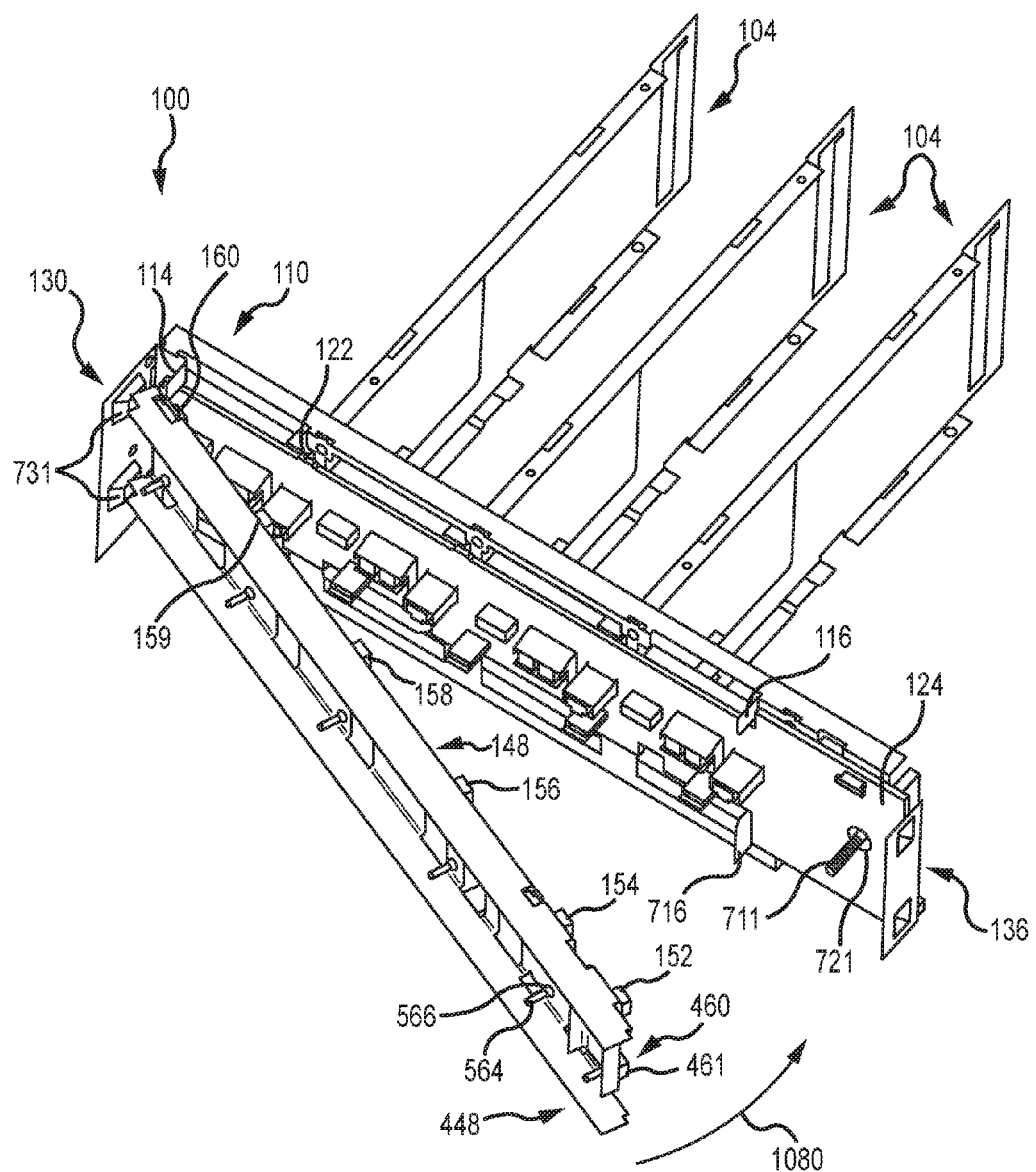
Figure 11:
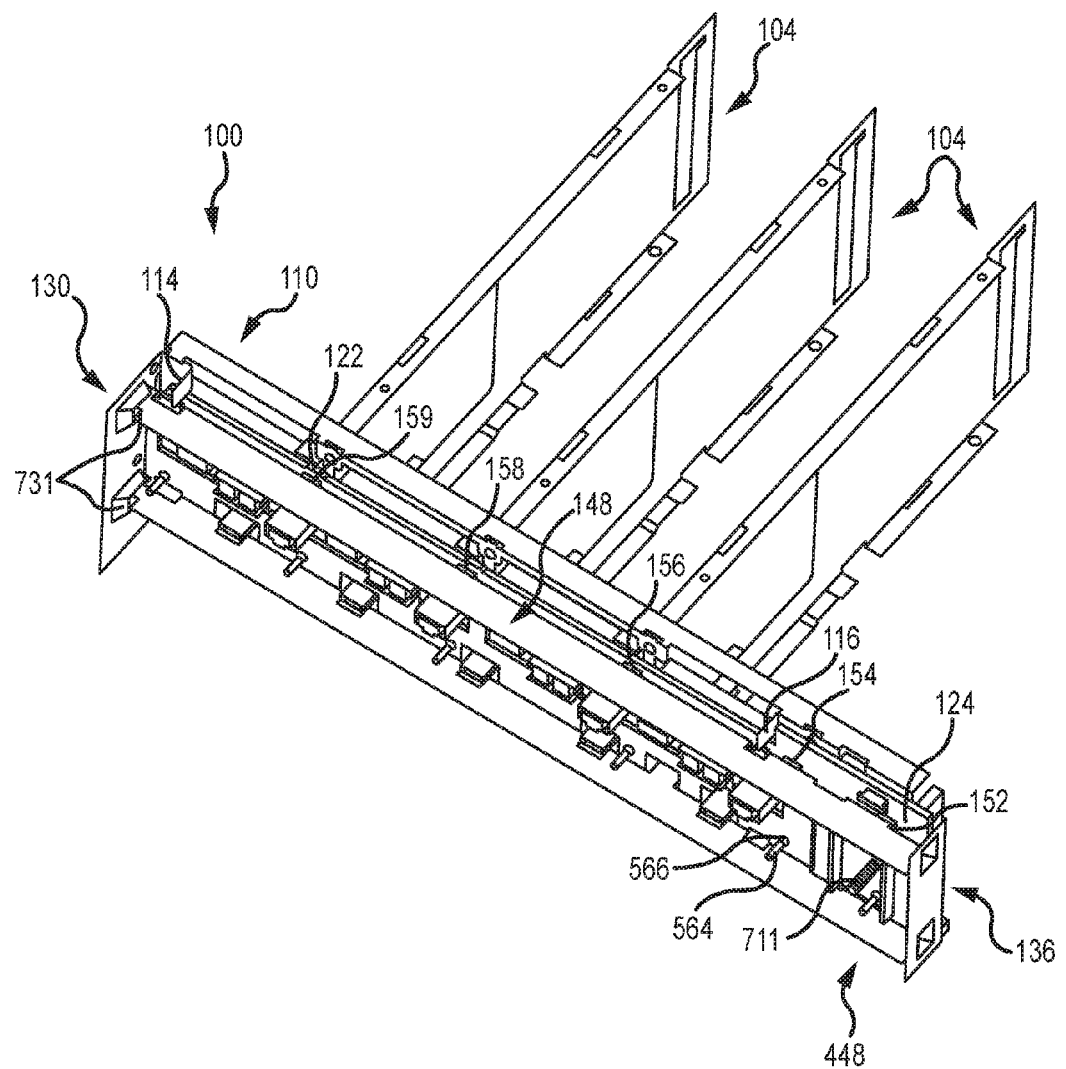
Figure 12:
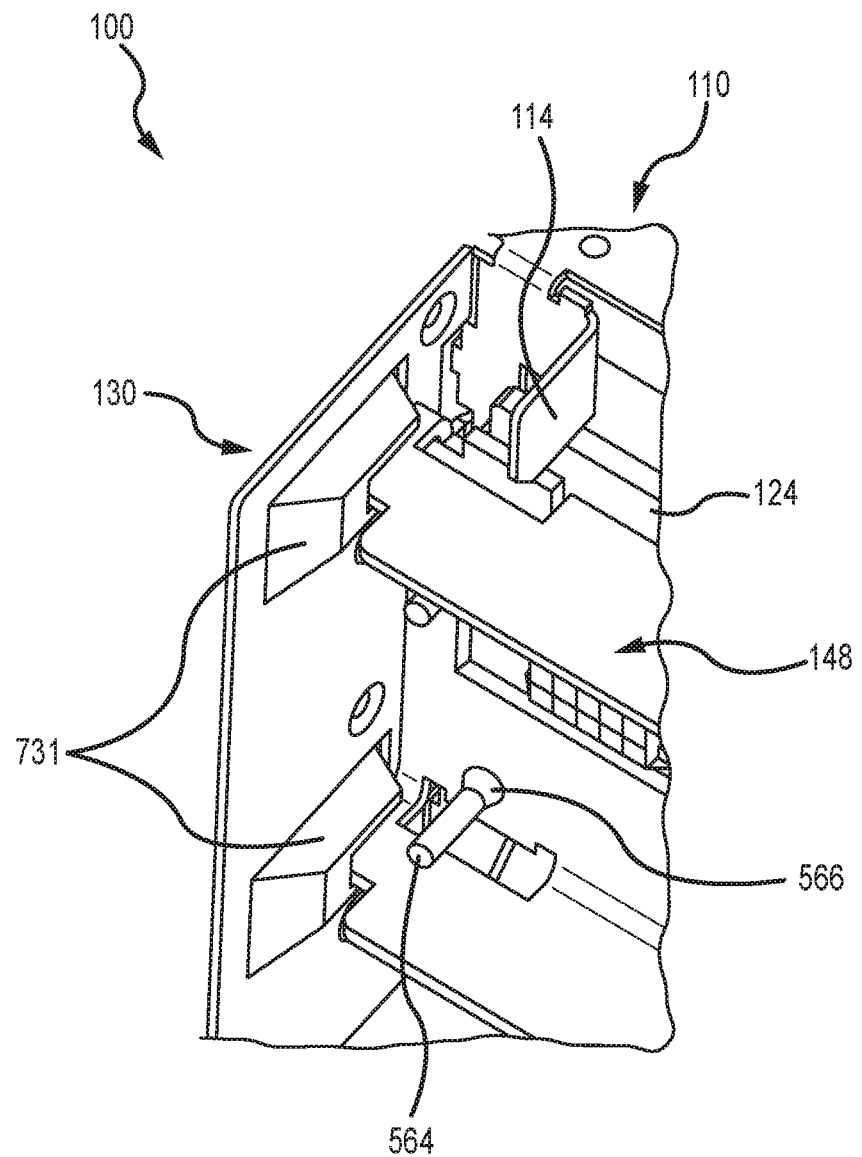
Figure 13:
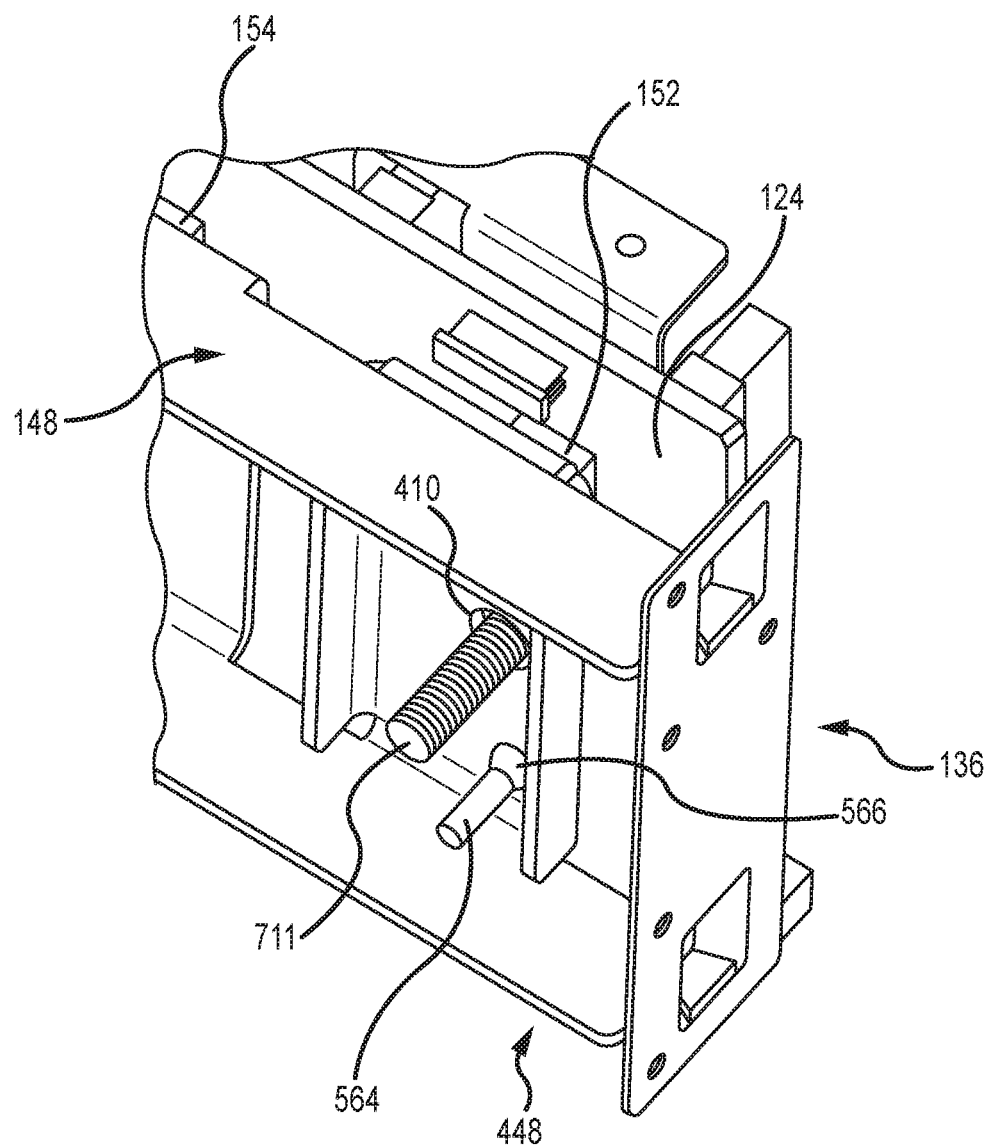

FIG. 10 illustrates the mounting assembly 100 after the hooks (including hook 145) of the clamp member 140 have been engaged with the hook receptacles or pivotal mounts on the chassis wall mounting element 130. Further, as shown with arrow 1080, the clamp member 140 is being rotated or pivoted about the two pivotal connections at its left end 144 provided by engaging the two hooks (including upper hook 145) with the receptacles 731 so as to move the pads of the compression spring assembly into contact with the board surface 124 as is shown in FIG. 11. FIG. 12 is a detailed view of the left end of the mounting assembly 100 after the clamp member 140 is rotated 1080 to abut (or have the pads abut) the board surface 124, and FIG. 13 is a detailed view of the right end of the mounting assembly 100 after full rotation/pivoting 1080 to sandwich the board 120 between the bulkhead 110 and the clamp member 140. As shown, the threaded member/rod 711 extends through the hole/passageway 410 in the body 142 of the clamp member 140 so that a fastener can engage the exposed threads to allow final assembly of the mounting assembly 100 (e.g., to torque the fastener so as to set the compression forces applied by the pads of the compression spring assembly on the surface 124 of the board 120).

Figure 14:
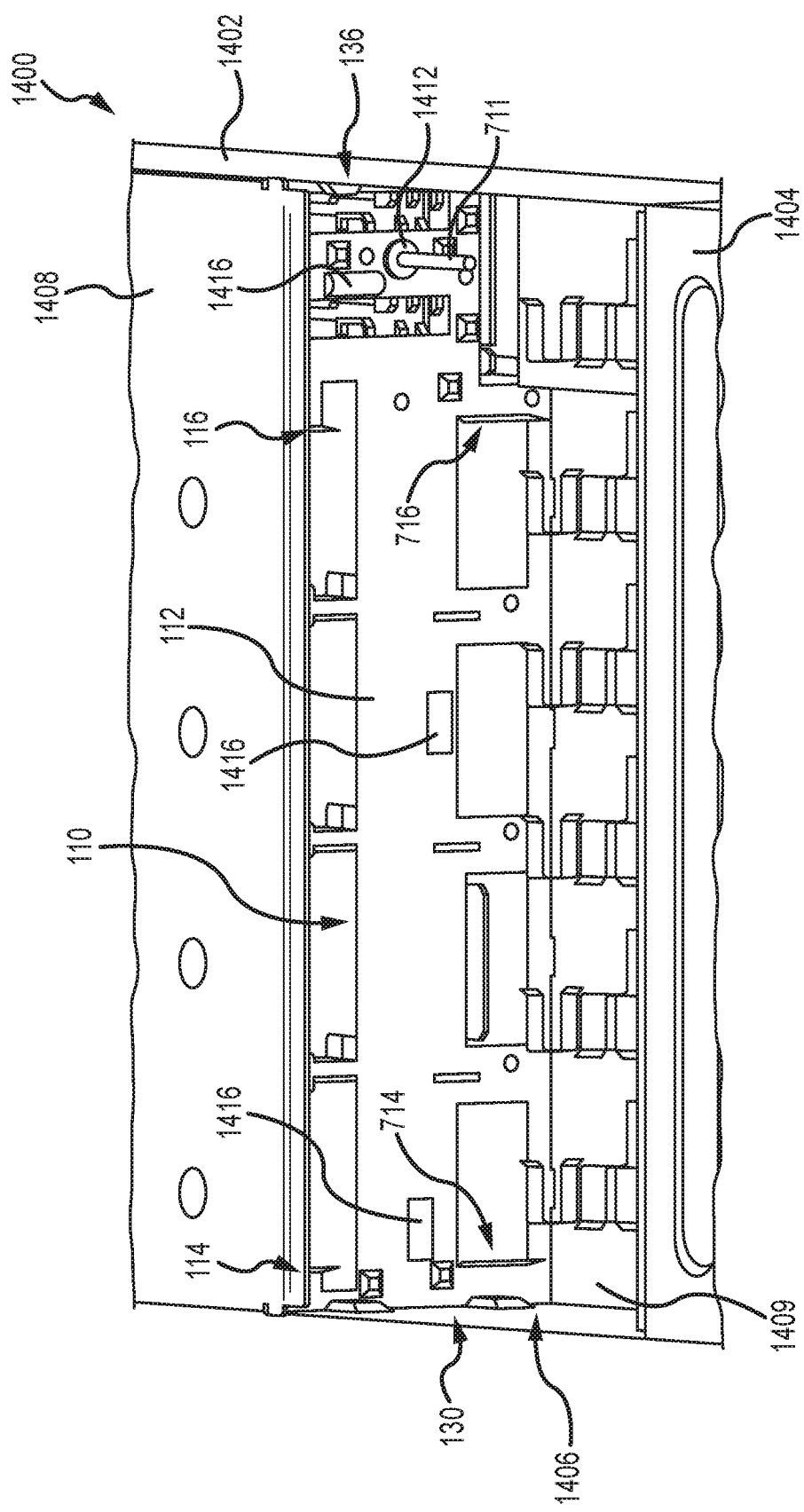
FIG. 14 illustrates a top perspective view a chassis with a bulkhead and chassis wall mounting elements installed within its interior space and with a cover of the chassis removed.

FIG. 14 illustrates a top perspective view a chassis 1400 with a top cover removed to assist in showing steps of assembling a mounting assembly within the chassis (e.g., a server enclosure or the like that will later be mounted on a rack) 1400, with the chassis 1400 shown with two sidewalls 1402, 1406 mounted on a base or base plate 1409 along with a front (or rear) wall 1404. One top cover 1408 is shown mounted on and extending between the sidewalls 1402, 1406. Specifically, the mounting assembly of FIGS. 1-13 is installed in the chassis 1400, highlighting additional components that may be included in the mounting assembly and to further explain the beneficial features of the new mounting assembly.

In FIG. 14, it can be seen that the bulkhead 110 extends orthogonally between the sidewalls 1402, 1406 and is oriented vertical to the base plate 1409. The locating tab 114, 116, 714, and 716 are visible in the view of FIG. 14 and are used to guide and position the later mounting of the board 120. FIG. 14 also shows that the bulkhead 110 includes the threaded member or rod 711 extending outward at one end to facilitate final fastening or mounting of the board 120 and clamp member 140 in the chassis 1400. A plastic washer 1412 may be fit over the threaded rod 711 to be sandwiched between the bulkhead surface 112 and the board surface 122. Further, a number or set of grounding gaskets 1416 may be provided on the surface 112 to electrically insulate and space apart the board 120 and the bulkhead 110 (which is typically formed as a stamped metal sheet). In this regard, the grounding gaskets 1416 may be formed of an elastomer (e.g., rubber) and take a form similar to the bumper elements (e.g., element 450 shown in FIG. 5), and the grounding gaskets 1416 are spaced apart on the bulkhead surface 112 and three are shown as being adequate to keep the board 120 spaced apart from the bulkhead 110 upon assembly and torqueing down the clamp member 140.

Figure 15:
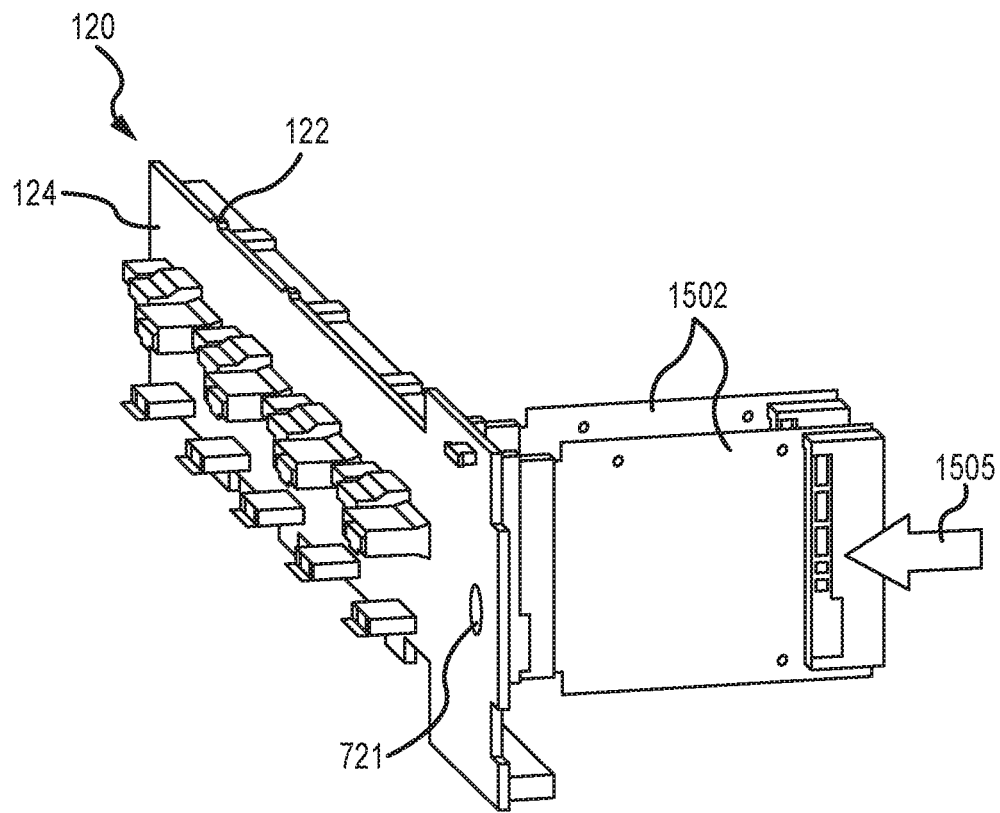
FIG. 15 illustrates a side perspective view of the assembly of installing additional boards (e.g., power distribution board (PDB) cards) to the circuit board (e.g., a midplane board)

FIG. 15 illustrates a side perspective view of portions of the mounting assembly that can be assembled prior to installation into the chassis 1400 of FIG. 14. Particularly, it may be desirable for additional boards to be affixed to the circuit board 120 prior to its installation in the chassis 1400. FIG. 14 shows, in this regard, installing, with arrow 1505, additional boards (e.g., power distribution board (PDB) cards) 1502 to the circuit board (e.g., a PCA used as a midplane board) 120. Specifically, the two PCB cards 1502 are inserted to connectors on the bulkhead-facing surface/side 122 of the board 120 prior to installing the board 120 into the chassis 1400.

Figure 16:
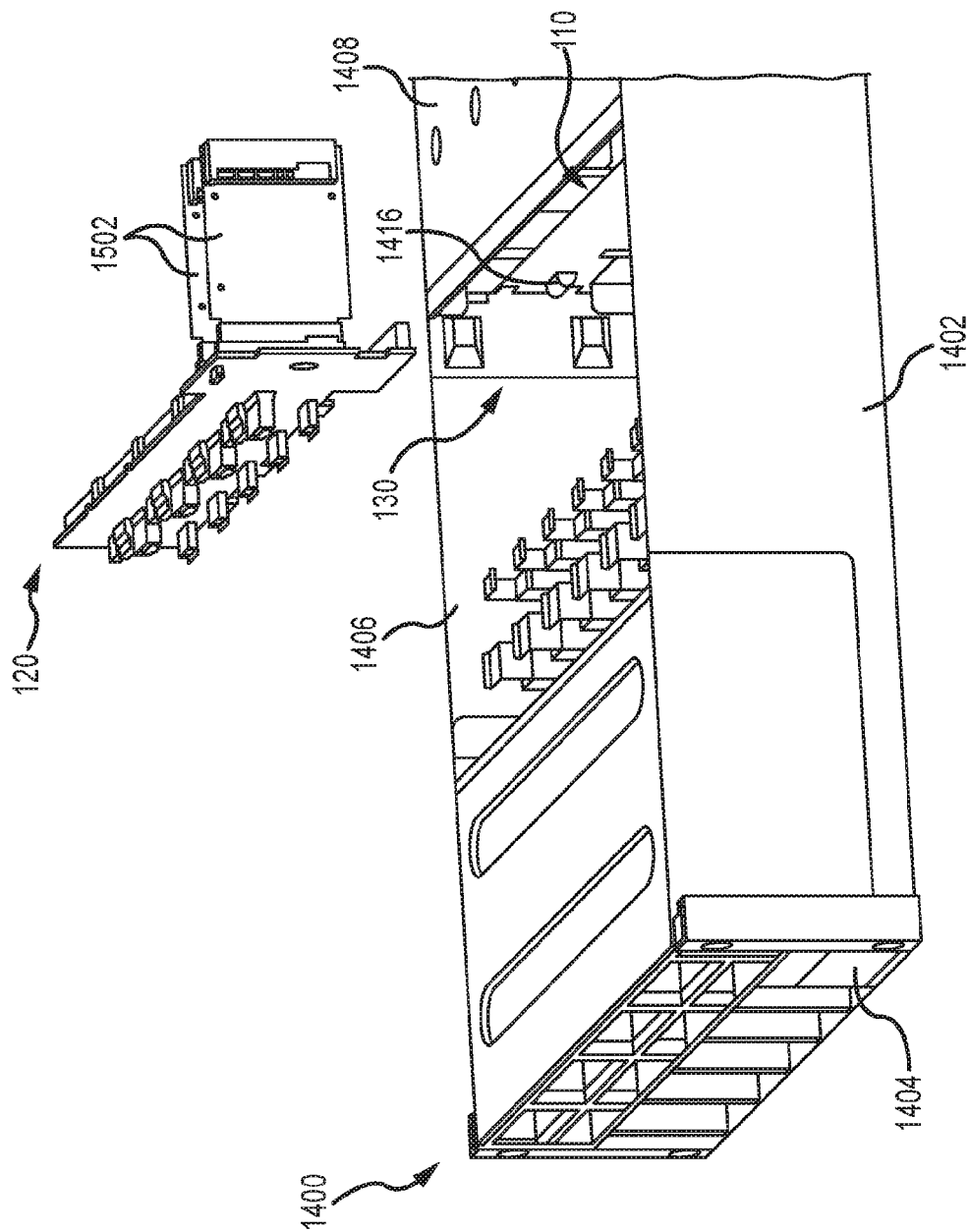
FIG. 16 illustrates the chassis of FIG. 14 with the board with attached PCB cards positioned over the chassis.
Figure 17:
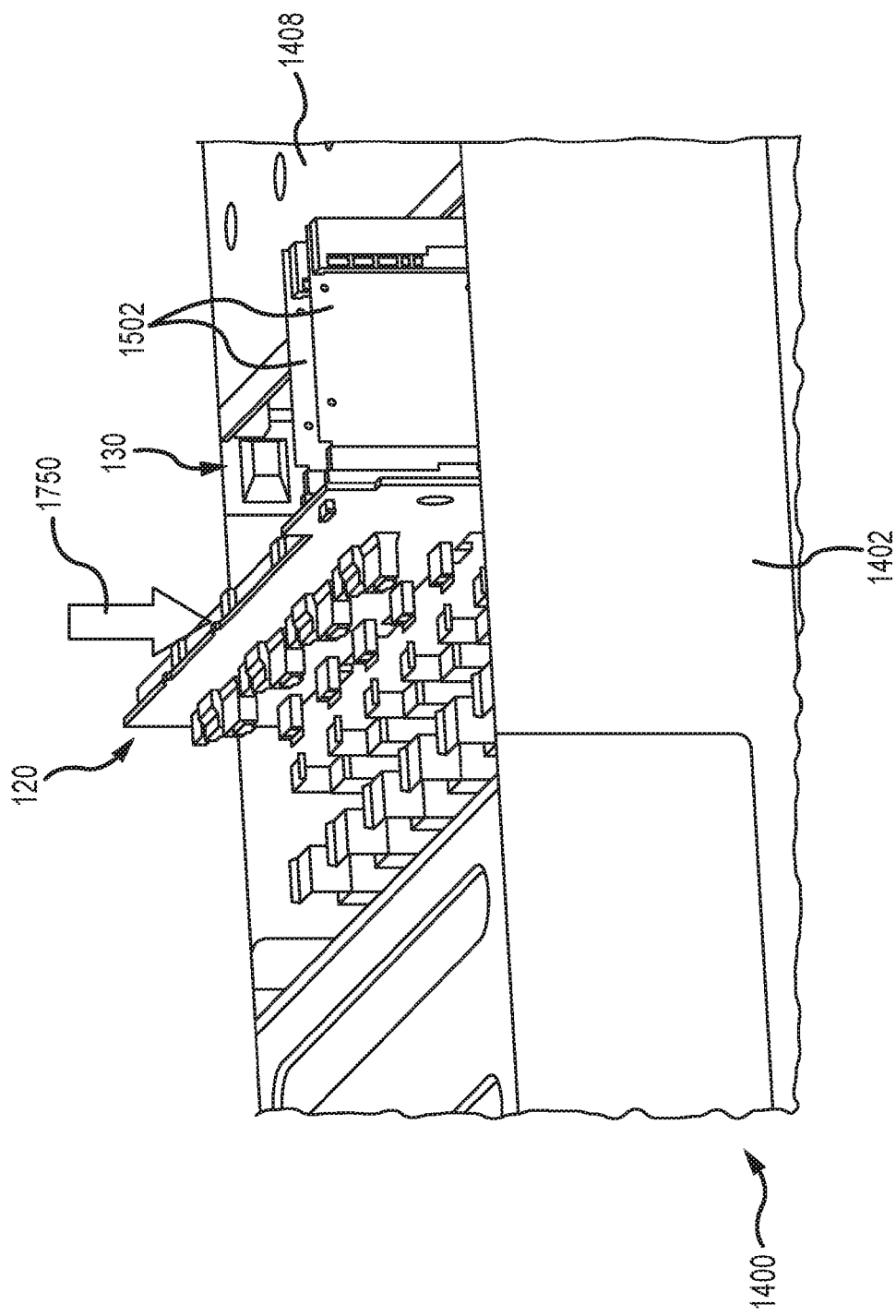
FIG. 17 illustrates the step of assembling the mounting assembly that involves lowering the board into the interior space of the chassis of FIG. 14.

FIG. 16 illustrates the chassis 1400 of FIG. 14 with the circuit board 120 with attached PCB cards 1502 positioned over the opening of the chassis 1400 prior to its insertion for mounting. FIG. 17 shows a next step in the assembly process that involves as shown with arrow 1750 with lowering the board 120 vertically downward into the open or interior space of the chassis between its sidewalls 1402, 1406. The board 120 forward of the bulkhead 110 so that the exposed ends/connectors of the PDB cards 1502 should clear the sheet metal cover/top 1408 of the chassis 1400.

Figure 18:
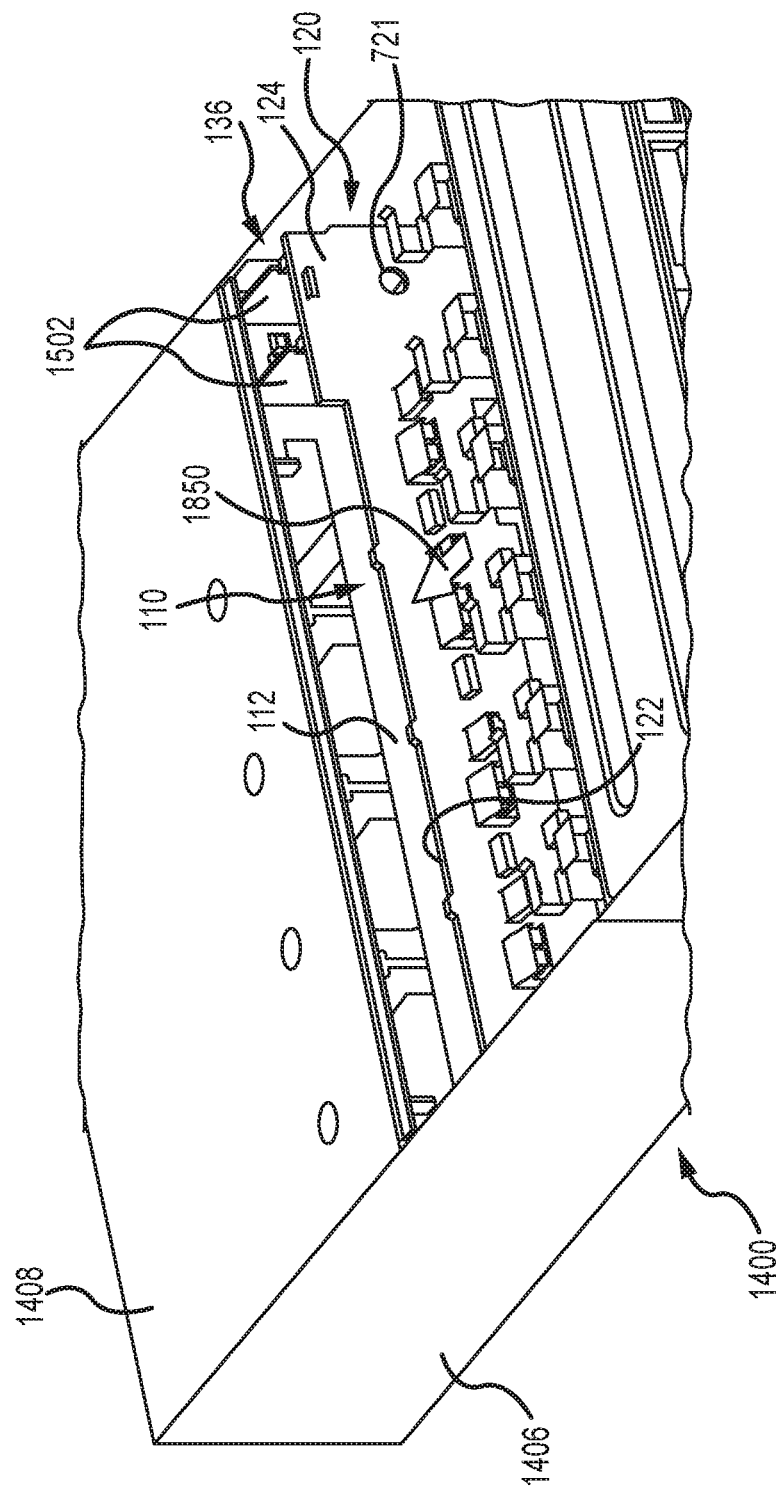
FIG. 18 illustrates a later step of assembling the mounting assembly that involves sliding the board against the bulkhead.
Figure 19:
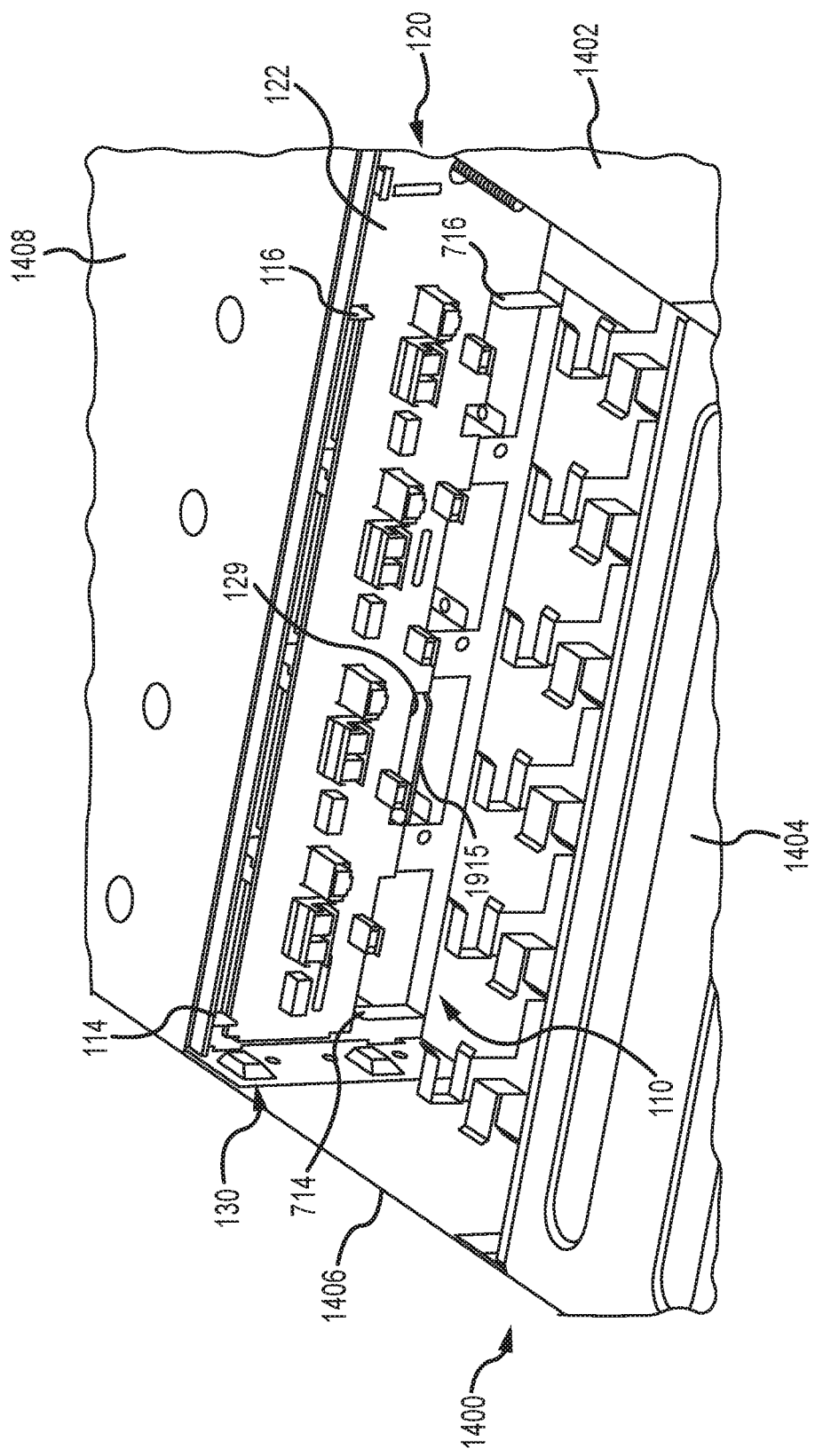
FIG. 19 illustrates the chassis after completion of the assembling step in FIG. 18.

FIG. 18 illustrates a later step of assembling the mounting assembly that involves sliding, as shown with arrow 1850, the circuit board 120 against the bulkhead 110. Particularly, the board 120 is held parallel to the bulkhead 110 and slid 1850 to cause the board surface 122 to contact the bulkhead surface/side 112 (or to cause the grounding gaskets on bulkhead 110 to contact the board surface 122). Also, the threaded member 711 is slid through the hole/passageway 721. FIG. 19 shows the chassis 1400 with the board 120 positioned against the bulkhead 110. As shown, the four vertical locating tabs 114, 116, 714, and 716 are used to locate the board 120 relative to the bulkhead 110 and to, after positioning, limit further vertical movement (i.e., to provide vertical or Y-axis alignment within the chassis 1400). Further, FIG. 19 shows that the bulkhead 110 further includes a horizontal locating tab 1915 in its set of locating tabs. The horizontal locating tab 1915 fits relatively tightly (e.g., a small clearance such as less than 1 mm on either side) within a groove/slot 129 on the lower edge of the board 120, and with the locating tab 1915 in this groove/slot 129, the board 120 is limited from further movement in the horizontal direction within the interior space of the chassis (i.e., to provide Y-axis or horizontal alignment of the board 120 and its connectors within the chassis 1400).

Figure 20:
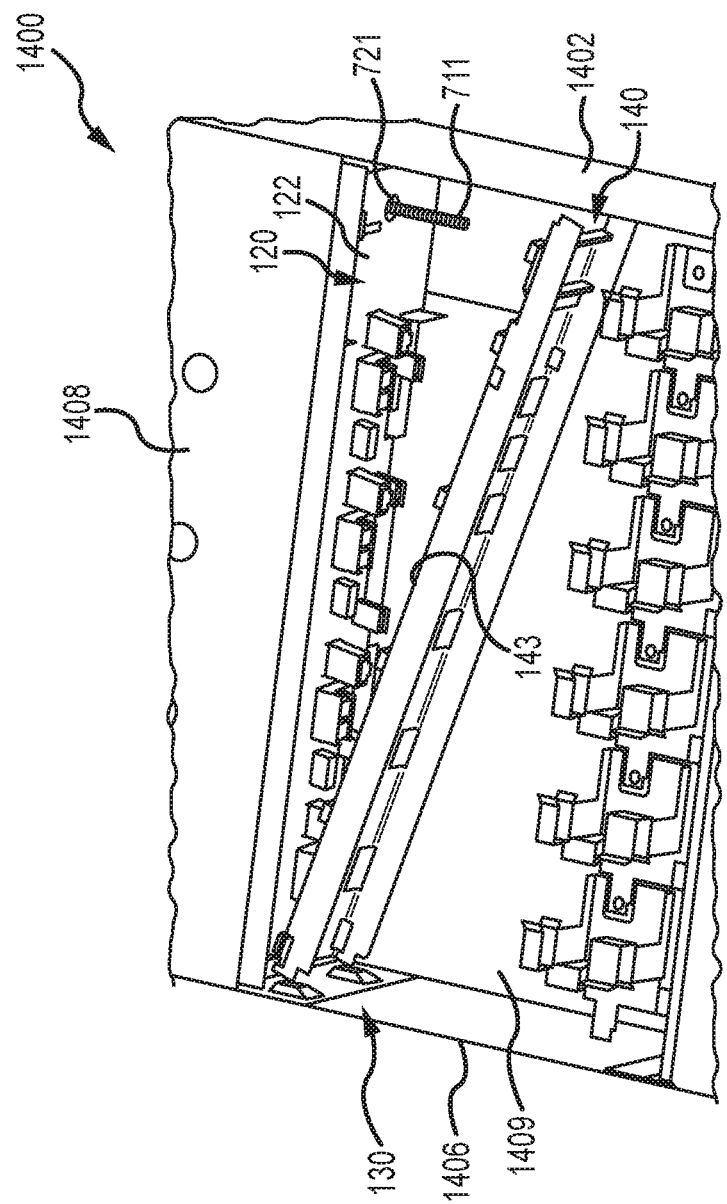
FIG. 20 illustrates a step of the assembling process that involves installing the clamp member.
Figure 21:
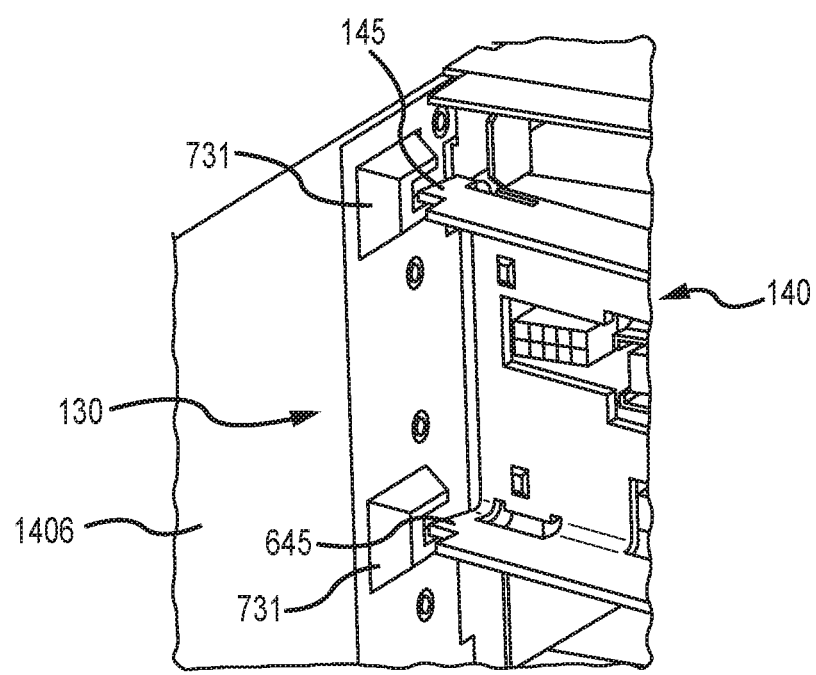
FIG. 21 illustrates a detailed view of the hook end of the clamp member with its pivotal connection with the chassis.

FIG. 20 illustrates a step of the assembling process that involves installing the clamp member 140 into the mounting assembly of the present description. FIG. 21 illustrates a detailed view of the hook end of the clamp member 140 with its pivotal connection with the chassis 1400. Particularly, with the circuit board 120 still against the bulkhead, the clamp member 140 is positioned in the interior space of the chassis 1400 with its surface/side 143 facing the board surface 122 and at an angle. Further, the hooks 145, 645 of the body 142 of the clamp member 140 in the hook receptacles/pivotal mounts 731 on chassis wall mounting element 130 (which is affixed to the chassis sidewall 1406).

Figure 22:
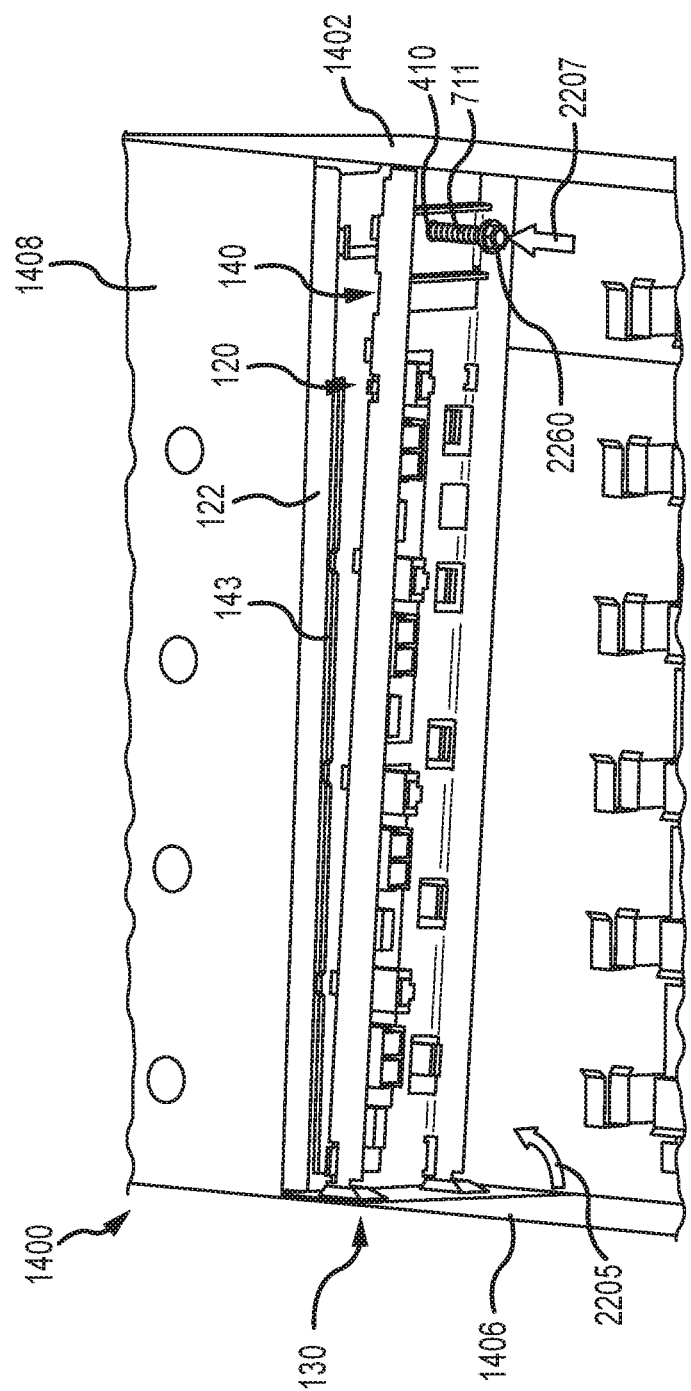
FIG. 22 illustrates a top perspective view of the chassis after the clamp member has been rotated into place against the board and with a fastener placed onto the tightening bolt.

FIG. 22 illustrates the chassis 1400 during later steps in the assembling process for the mounting assembly of the present description. Arrow 2205 shows that this assembling step includes, with hooks and locating tabs engaged on the left side, rotating clamp member 140 toward the board 120 (e.g., clamp surface 143 toward board surface 122). FIG. 22 also shows that once the bolt/threaded member 711 through the hole/passageway 410 in the clamp body 142 a fastener (e.g., a flange nut or the like) 2260 is threaded onto the end of the bolt/threaded member 711 as shown with arrow 2207.

Figure 23:
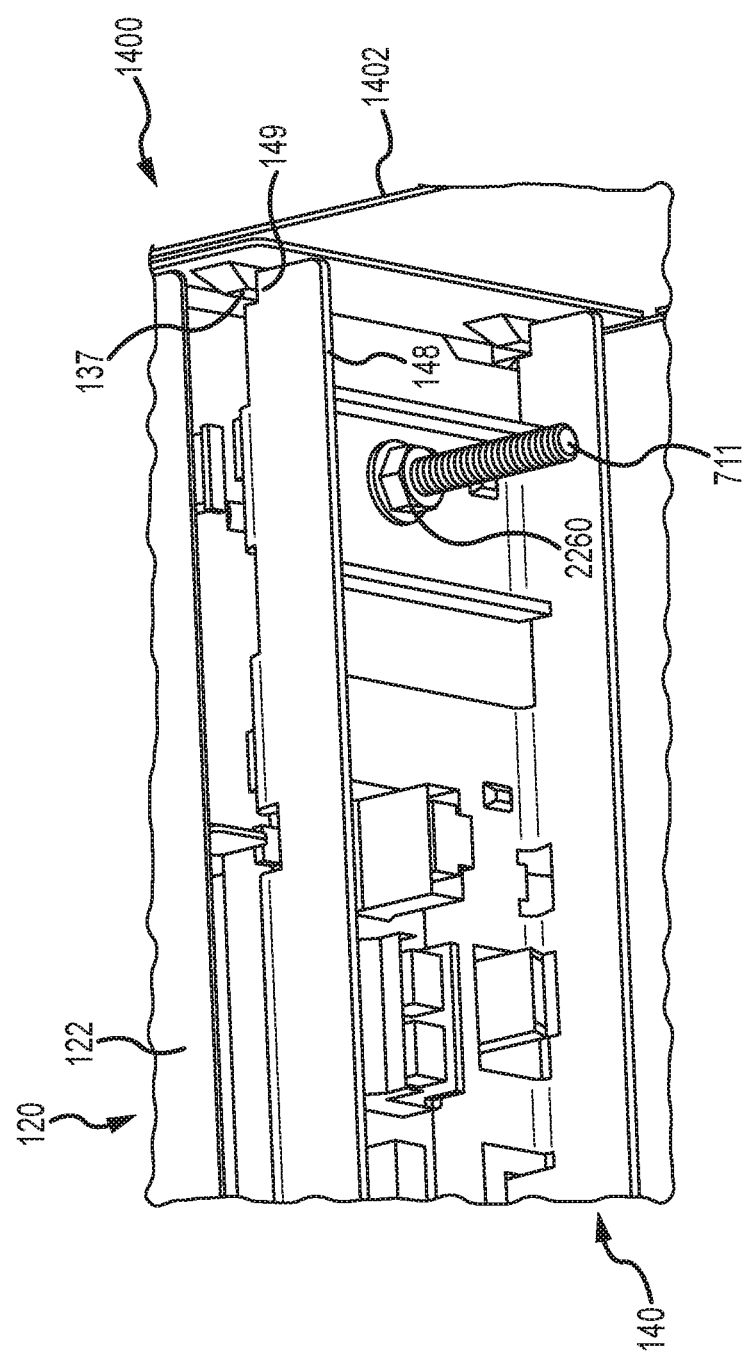
FIG. 23 illustrates a detailed or enlarged view of the fastener end of the mounting assembly showing the location of the board components with the fastener properly or wholly tightened to a predefined torque.

Once alignment is confirmed, a torque driver/socket or other tool is used to tighten the nut 2260 to a predefined torque value. FIG. 23 illustrates the chassis 1400 after completion of this fastener-tightening step, and, in addition to the torque value, complete assembly can be verified by visual verification that the lip/recessed surface 149 of the body 142 of the clamp member 140 (as well as the lower lip/surface) is seated on/against the stop 137 on the chassis wall mounting element 136 (which may be provided as an embossed feature on the chassis 1400 in some cases). The mounting assembly is now fully assembled with the circuit board 120 sandwiched between the bulkhead 110 and clamp member 140, which provides accurate positioning of the board 120 in the chassis 1400.

While this disclosure contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The mounting assembly described herein lowers cost of chassis-based devices that include a circuit board (e.g., a midplane board or the like). Because the bulkhead is not actively bearing the load of the circuit board (e.g., it may be borne by the divider walls in the chassis), the bulkhead of the mounting assembly is allowed to be less stiff and/or more lightweight such that it is more prone to bending. In one useful example, the bulkhead was formed from 1-mm thick sheet metal. The mounting assembly design eliminates the need for an expensive machined bulkhead with its corresponding tapped holes and numerous fasteners used for prior assembly methods. The number of fasteners is greatly reduced (e.g., to a single fastener from six or more).

The new mounting assembly is configured to improve assembly/disassembly time. The board slides onto datum features on the bulkhead, the clamp member is swung into place against the board, and a single nut (or similar fastener) is used to fasten the clamp member to the bulkhead (and the board onto the chassis). No special tools are needed, and this assembly process can be easily performed by a field technician. The new assembly has a tight tolerance loop, which allows for more complex systems in a smaller chassis. For example, when only simple profile latches are needed instead of space-consuming ejectors or floating connectors/boards. With the new mounting assembly design, connector mating is provided with improved reliability relative to prior designs. The mounting assembly may be used in nearly any chassis-based device in which full connector mating with tight tolerances is critical or desired, when ease of board assembly is a design advantage, and when pressure loading on a board can be variable or is targeted in specific areas.

We claim:

1. A computing apparatus adapted for efficient installation of a circuit board such as a midplane board, comprising:
   a chassis comprising a first sidewall and a second sidewall opposite the first sidewall;
   a bulkhead extending orthogonally between the first and second sidewalls of the chassis;
   a clamp member with a planar body oriented parallel to the bulkhead, wherein the clamp member is pivotally coupled at a first end to the first sidewall and is coupled at a second end opposite the first end to the bulkhead;
   a circuit board sandwiched between the bulkhead and the body of the clamp member with a first side facing the bulkhead and a second side facing the body of the clamp member; and
   a compression spring assembly on a surface of the planar body of the clamp member that faces the second side of the circuit board,
   wherein the compression spring assembly applies at least one preload force to the second side of the circuit board urging the circuit board toward the bulkhead,
   wherein the compression spring assembly comprises a plurality of spaced-apart bumper elements mounted on the planar body of the clamp member each having a pad formed of an elastomer on the surface of the planar body of the clamp member;
   wherein the planar body is pivotally coupled to the first sidewall via at least one hook on the first end of the body of the clamp member and at least one hook receptacle on an inward facing surface of the first sidewall of the chassis;
   wherein the second end of the planar body of the clamp member is coupled to the bulkhead via a threaded member extending from and affixed to the bulkhead and a fastener threaded onto the threaded member and abutting the planar body of the clamp member; and
   wherein the fastener is torqued to a predefined torque or until a lip on the second end of the planar body contacts a stop provided on the second sidewall of the chassis.

2. The apparatus of claim 1, wherein the elastomer comprises rubber.

3. The apparatus of claim 1, wherein the planar body has a length as measured between the first and second ends that is equal to or greater than a length of the circuit board and wherein the clamp member includes a least one stiffening element extending orthogonally outward from an edge of the planar body between the first and second ends of the planar body.

4. The apparatus of claim 1, wherein the bulkhead includes a set of locating tabs extending outward from a side of the bulkhead that faces the circuit board and wherein the circuit board is positioned relative to the bulkhead with one or more tab receiving surfaces abutting or proximate to each of the locating tabs, whereby the circuit board is accurately positioned relative to the bulkhead.

5. The apparatus of claim 4, wherein the set of locating tabs includes at least two vertical locating tabs limiting vertical travel of the circuit board and at least one horizontal locating tabs limiting horizontal travel of the circuit board.

6. The apparatus of claim 1, wherein the circuit board comprises a printed circuit assembly (PCA) with a set of connectors positioned within the chassis by mating between the circuit board and locating tabs on the bulkhead.

7. A mounting assembly for mounting a midplane board or other circuit board within an interior space of a chassis, comprising:
   a bulkhead adapted for mounting within the interior space of the chassis between left and right sidewalls, wherein the bulkhead includes a plurality of locating tabs extending from a substantially planar surface;
   a circuit board positionable against the substantially planar surface of the bulkhead, wherein the circuit board is parallel to the planar surface of the bulkhead and is located relative to the bulkhead with a number of surfaces contacting the locating tabs;
   a spring assembly comprising a plurality of bumper elements; and
   a clamp member comprising a planar body with supporting the bumper elements with a compressible pad of each of the bumper elements provided on a surface that is positioned to face the circuit board during assembly of the mounting assembly,
   wherein after completion of the assembly of the mounting assembly the circuit board is sandwiched between the bulkhead and the clamp member with each of the compressible pads compressed and applying a force on the circuit board urging it toward the substantially planar surface of the bulkhead,
   wherein the compressible pads are formed of an elastomeric material, the mounting assembly further including at least one threaded member extending through the circuit board and the body of the clamp member upon assembly of the mounting assembly and a fastener mountable on the threaded member for moving the body of the clamp member into a predefined position relative to the substantially planar surface of the bulkhead,
   whereby the compressible pads are compressed by a predefined amount when the fastener is torqued to a predefined torque or until a lip on the body of the clamp member contacts a stop in the chassis,
   wherein the clamp member includes at least one hook on one end of the planar body, and
   wherein the mounting assembly further includes a chassis wall mounting element attachable to one of the left or right sidewalls of the chassis, the at least one hook being pivotally coupled with at least one receptacle in the chassis wall mounting element upon the completion of the assembly of the mounting assembly.

8. The mounting assembly of claim 7, wherein the clamp member further includes at least one stiffening member extending outward from the planar body of the clamp member along at least one edge of the planar body and wherein the planar body of the clamp member has a length at least equal to a length of the circuit board.

9. An apparatus, comprising:
   a chassis comprising a first sidewall and a second sidewall opposite the first sidewall;
   a bulkhead extending between the first and second sidewalls of the chassis;
   a clamp member with a body pivotally coupled at a first end to the first sidewall and coupled at a second end opposite the first end to the bulkhead;

a PCA board sandwiched between the bulkhead and the body of the clamp member with a first side facing the bulkhead and a second side facing the body of the clamp member; and a spring assembly on a surface of the planar body of the clamp member that faces the second side of the PCA board, wherein the spring assembly applies preload forces to the second side of the PCA board urging first side of the PCA board toward the bulkhead, wherein the spring assembly comprises a plurality of bumper elements mounted on the body of the clamp member and wherein each of the bumper elements has a pad formed of an non-conductive material on the surface of the planar body of the clamp member, wherein the non-conductive material comprises an elastomer, wherein the body of the clamp member is pivotally coupled to the first sidewall via at least one hook on the first end of the body of the clamp member and at least one hook receptacle on an inward facing surface of the first sidewall of the chassis, wherein the second end of the body of the clamp member is coupled to the bulkhead via a threaded member extending from and affixed to the bulkhead and a fastener threaded onto the threaded member and abutting the body of the clamp member upon tightening, wherein the fastener is torqued to a predefined torque or until a lip on the second end of the planar body contacts a stop provided on the second sidewall of the chassis.

10. The apparatus of claim 9, wherein the clamp member includes a least one stiffening element extending orthogonally outward from an edge of the body of the clamp member between the first and second ends of the body of the clamp member.

11. The apparatus of claim 9, wherein the bulkhead includes a set of locating tabs extending outward from a side of the bulkhead that faces the PCA board, wherein the PCA board is positioned relative to the bulkhead with one or more tab receiving surfaces abutting or proximate to each of the locating tabs, and wherein the set of locating tabs includes at least two vertical locating tabs limiting vertical travel of the PCA board and at least one horizontal locating tabs limiting horizontal travel of the PCA board.

* * * * *

UNITED STATES PATENT AND TRADEMARK OFFICE
CERTIFICATE OF CORRECTION

PATENT NO. : 9,826,655 B1
APPLICATION NO. : 15/380339
DATED : November 21, 2017
INVENTOR(S) : Di Ricco Kurzava et al.

Page 1 of 1

It is certified that error appears in the above-identified patent and that said Letters Patent is hereby corrected as shown below:

In the Specification

In Column 5, Line 44, delete "IOEU" and insert -- IUOE --, therefor.

Signed and Sealed this
Third Day of July, 2018

Andrei Iancu
*Director of the United States Patent and Trademark Office*